US010251289B2

(12) United States Patent
Chen et al.

(10) Patent No.: US 10,251,289 B2
(45) Date of Patent: Apr. 2, 2019

(54) HEAD-MOUNTED DISPLAY

(71) Applicant: Quanta Computer Inc., Taoyuan (TW)

(72) Inventors: Chun-Lung Chen, Taoyuan (TW); Chien-Hsien Sung, Taoyuan (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 27 days.

(21) Appl. No.: 15/826,954

(22) Filed: Nov. 30, 2017

(65) Prior Publication Data

US 2019/0037715 A1   Jan. 31, 2019

(30) Foreign Application Priority Data

Jul. 25, 2017  (TW) .............................. 106124873 A

(51) Int. Cl.
*G06F 1/16* (2006.01)
*H05K 5/02* (2006.01)
*H05K 5/00* (2006.01)
*H04N 13/344* (2018.01)

(52) U.S. Cl.
CPC ......... *H05K 5/0217* (2013.01); *H05K 5/0017* (2013.01); *H04N 13/344* (2018.05); *H04N 2213/001* (2013.01); *H04N 2213/008* (2013.01)

(58) Field of Classification Search
CPC .. H05K 5/0217; H05K 5/0017; H05K 5/0221; H04N 13/344; H04N 2213/001; H04N 2213/008; H04N 5/7491; G06F 1/163
See application file for complete search history.

(56) References Cited

U.S. PATENT DOCUMENTS

| 2016/0255748 | A1* | 9/2016 | Kim | H05K 7/20972 |
| | | | | 361/695 |
| 2017/0094816 | A1* | 3/2017 | Yun | G02B 27/022 |
| 2017/0171992 | A1* | 6/2017 | Long | H05K 5/0026 |
| 2017/0248990 | A1* | 8/2017 | Chen | G06F 1/163 |
| 2017/0363874 | A1* | 12/2017 | Tricoukes | G02B 27/0176 |
| 2018/0027676 | A1* | 1/2018 | Araki | H05K 5/0221 |
| 2018/0295733 | A1* | 10/2018 | Wen | H05K 5/0017 |
| 2018/0299681 | A1* | 10/2018 | Eastwood | A45F 5/00 |
| 2018/0364490 | A1* | 12/2018 | Lin | G02B 27/0176 |
| 2018/0364491 | A1* | 12/2018 | Park | G02B 27/0176 |

FOREIGN PATENT DOCUMENTS

CN            102245042 A      11/2011

OTHER PUBLICATIONS

Chinese language office action dated Dec. 26, 2017, issued in application No. TW 106124873.

* cited by examiner

*Primary Examiner* — Hoa C Nguyen
*Assistant Examiner* — Christopher L Augustin
(74) *Attorney, Agent, or Firm* — McClure, Qualey & Rodack, LLP

(57) ABSTRACT

A head-mounted display includes a display device, a bonding structure connected to the display device, an adjusting mechanism connected to the bonding structure, and a rotation button connected to the adjusting mechanism. When the rotation button is rotated, the length of the bonding structure is changed by the adjusting mechanism.

11 Claims, 20 Drawing Sheets

HEAD-MOUNTED DISPLAY

CROSS-REFERENCE TO RELATED APPLICATIONS

This Application claims priority of Taiwan Patent Application No. 106124873 filed on Jul. 25, 2017, the entirety of which is incorporated by reference herein.

BACKGROUND OF THE INVENTION

Field of the Invention

The present disclosure relates to a display, and in particular to a head-mounted display.

Description of the Related Art

A conventional virtual reality apparatus is configured to be worn on the user's head, and to provide 3D (three dimensional) images to the user.

In general, a conventional virtual reality apparatus includes a display panel, and two lenses that correspond to the user's two eyes. The display panel is configured to display a left-eye image and a right-eye image, respectively entering through the left eye and the right eye via the lenses, and a 3D image is presented by the left-eye image and the right-eye image.

Although conventional virtual reality apparatuses have generally been adequate for their intended purposes, they have not been entirely satisfactory in all respects. Consequently, it is desirable to provide a solution for improving upon conventional virtual reality apparatuses.

BRIEF SUMMARY OF THE INVENTION

The disclosure provides a head-mounted display, which can be easily donned and removed from the user's head.

The disclosure provides a head-mounted display including a display device, a bonding structure, and an adjusting device. The bonding structure is connected to the display device, and includes a first bonding band having a first end, and a second bonding band having a second end. The adjusting device is connected to the bonding structure, and includes a housing, an adjusting mechanism, and a rotation button. The first bonding band and the second bonding band are movably disposed in the housing. The adjusting mechanism is disposed in the housing, and connected to the first bonding band and the second bonding band. The rotation button is connected to the adjusting mechanism. When the rotation button is rotated, the adjusting mechanism changes the distance between the first end and the second end.

In conclusion, the user can rotate the rotation button with one hand to change the length or size of the bonding structure, and thus the head-mounted display can be easily donned and removed from the user's head.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
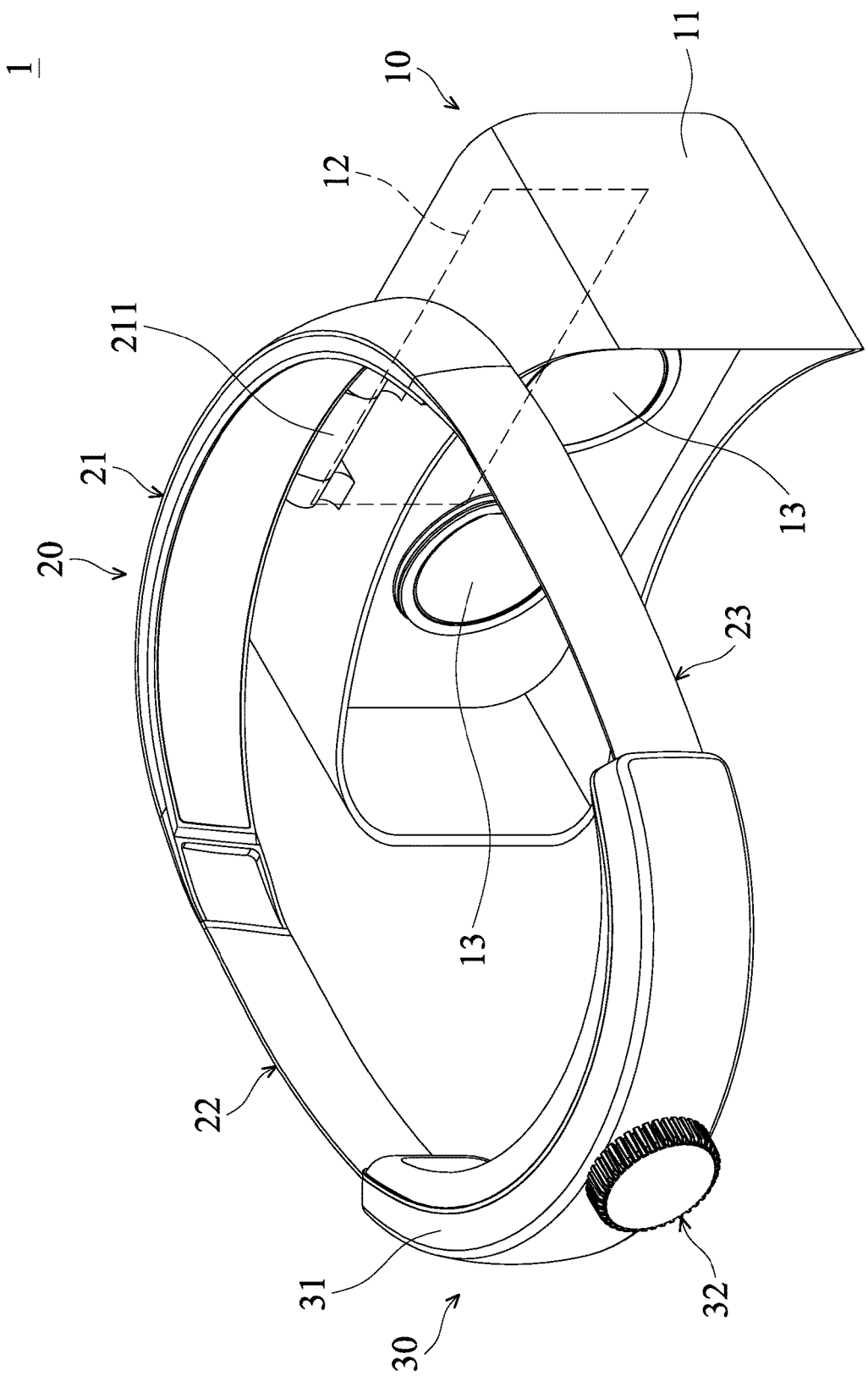
FIG. 1 is a perspective view of a head-mounted display in accordance with a first embodiment of the disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as upper and lower, may be used herein for ease of description to describe one element or feature's relationship to another element(s) or feature(s) as illustrated in the figures. The spatially relative terms are intended to encompass different orientations of the device in use or operation in addition to the orientation depicted in the figures. The shape, size, and thickness in the drawings may not be drawn to scale or simplified for clarity of discussion; rather, these drawings are merely intended for illustration.

Figure 2:
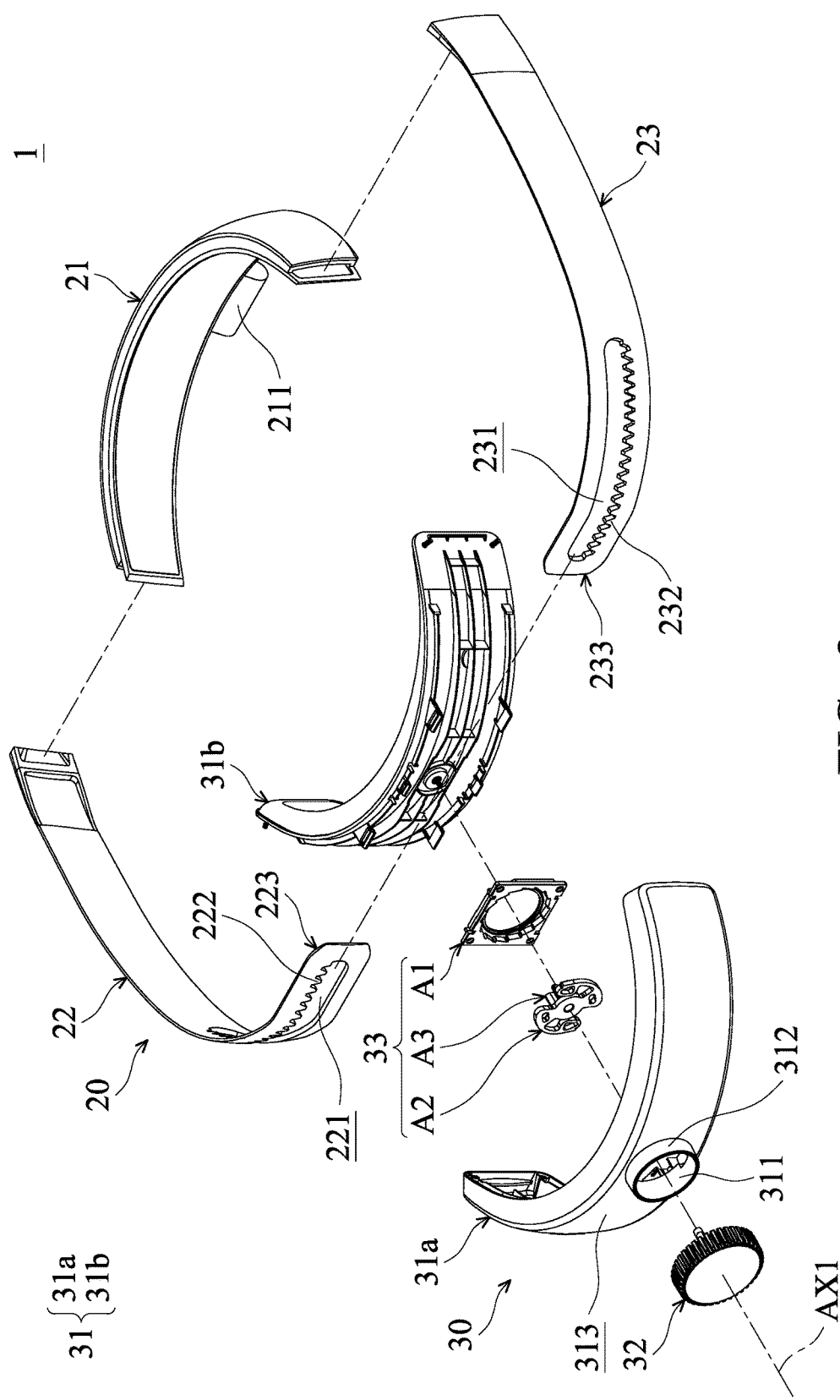
FIG. 2 is an exploded view the head-mounted display in accordance with the first embodiment of the disclosure, wherein the display device is not illustrated.

FIG. 1 is a perspective view of a head-mounted display 1 in accordance with a first embodiment of the disclosure. FIG. 2 is an exploded view the head-mounted display 1 in accordance with the first embodiment of the disclosure. For clarity, the display device 10 is not illustrated in FIG. 2. The head-mounted display 1 is configured to be worn on the user's head, and provides 2D (two dimensional) images or 3D (three dimensional) images. In some embodiments, the head-mounted display 1 may be a head-mounted virtual reality apparatus.

The head-mounted display 1 includes a display device 10, a bonding structure 20, and an adjusting device 30. The bonding structure 20 is connected to two ends of the display device 10, and the adjusting device 30 is connected to the bonding structure 20. In this embodiment, the bonding structure 20 and the adjusting device 30 are formed as a ring-like structure. In some embodiments, the bonding structure 20 and the adjusting device 30 are formed as a U-shaped structure.

When the user wears the head-mounted display 1, the length or size of the bonding structure 20 can be firstly increased by adjusting the adjusting device 30, and thus the bonding structure 20 is disposed surrounding the head. Afterwards, the length or size of the bonding structure 20 can be decreased by adjusting the adjusting device 30, and thus the display device 10 can be stably disposed on the user's head.

The display device 10 includes a display housing 11 and a display panel 12. The display panel 12 is disposed in the display housing 11. The display panel 12 may be a liquid-crystal display panel (LCD panel) or an organic light-emitting diode panel (OLED panel), and is configured to display an image. In some embodiments, the image includes a left-eye image and a right-eye image different from the left-eye image. In some embodiments, there are two display panels 12 providing a left-eye image and a right-eye image. In a particular embodiment, the display panel 12 is a mobile phone or a display of a mobile device. When the head-mounted display 1 provides a 3D image, the head-mounted display 1 displays different images to the right eye and the left eye.

In the embodiment, the display device 10 further includes lenses 13. The lenses 13 are disposed on the display housing 11, and face the display panel 12. In this embodiment, there are at two lenses 13. When the user wears the head-mounted display 1, the lenses 13 correspond to the left eye and the right eye. In some embodiments, there are at least four lenses 13. Some of the lenses 13 correspond to the left eye, and some of the lenses 13 correspond to the right eye.

The bonding structure 20 includes a connection element 21, a first bonding band 22, and a second bonding band 23. The connection element 21 may be an elongated structure. Moreover, the connection element 21 may be a curved structure corresponding to the user's head. The connection element 21 includes a combination element 211. The display device 10 is disposed on the combination element 211, and thus the display device 10 is combined with the bonding structure 20 via the combination element 211. In some embodiments, the display device 10 is coupled with the combination element 211, and thus the connection element 21 can be rotated relative to the display device 10.

One end of the first bonding band 22 is connected to the connection element 21. In some embodiments, the first bonding band 22 is affixed to the connection element 21. The first bonding band 22 includes a first guiding groove 221 and a first gear rack 222. The first gear rack 222 and the first guiding groove 221 are elongated structure extending along the first bonding band 22. The first gear rack 222 is located in the first guiding groove 221, and the first gear rack 222 and the first guiding groove 221 are located at a first end 223 of the first bonding band 22.

One end of the second bonding band 23 is connected to the connection element 21. In other words, two ends of the connection element 21 are connected to the first bonding band 22 and the second bonding band 23. In some embodiments, the second bonding band 23 is affixed to the connection element 21. The second bonding band 23 includes a second guiding groove 231 and a second gear rack 232. The second gear rack 232 and the second guiding groove 231 are elongated structures extending along the longitudinal direction of the second bonding band 23. The second gear rack 232 is located in the second guiding groove 231, and the second gear rack 232 and the second guiding groove 231 are located at a second end 233 of the second bonding band 23.

In some embodiments, the bonding structure 20 may not include a connection element 21, and the bonding structure 20 may have a U-shaped structure. The first bonding band 22 and the second bonding band 23 are connected to the display housing 11 of the display device 10.

The adjusting device 30 is connected to the first bonding band 22 and the second bonding band 23 of the bonding structure 20. The first bonding band 22 and the second bonding band 23 are overlapped in the adjusting device 30. The adjusting device 30 is configured to adjust the overlapped portions of the first bonding band 22 and the second bonding band 23 so as to change the length or size of the bonding structure 20. By adjusting the length or size of the bonding structure 20, the display device 10 can be stably worn on the user's head, and the head-mounted display 1 can be easily removed from the user's head.

The adjusting device 30 includes a housing 31, a rotation button 32, and an adjusting mechanism 33. The housing 31 may be an elongated structure. Moreover, the housing 31 may be a curved structure corresponding to the user's head. The first bonding band 22 and the second bonding band 23 are movably disposed in the housing 31.

In this embodiment, the housing 31 includes a first housing 31a and a second housing 31b. The first housing 31a is disposed on the second housing 31b. The first bonding band 22, the second bonding band 23, and the adjusting mechanism 33 are disposed between the first housing 31a and the second housing 31b. The first housing 31a includes an opening 311, a button base 312, and an outer surface 313. The opening 311 is formed on the outer surface 313, and the button base 312 is disposed on the outer surface 313. The button base 312 may be a ring-like structure corresponding to the size of the opening 311.

Figure 3:
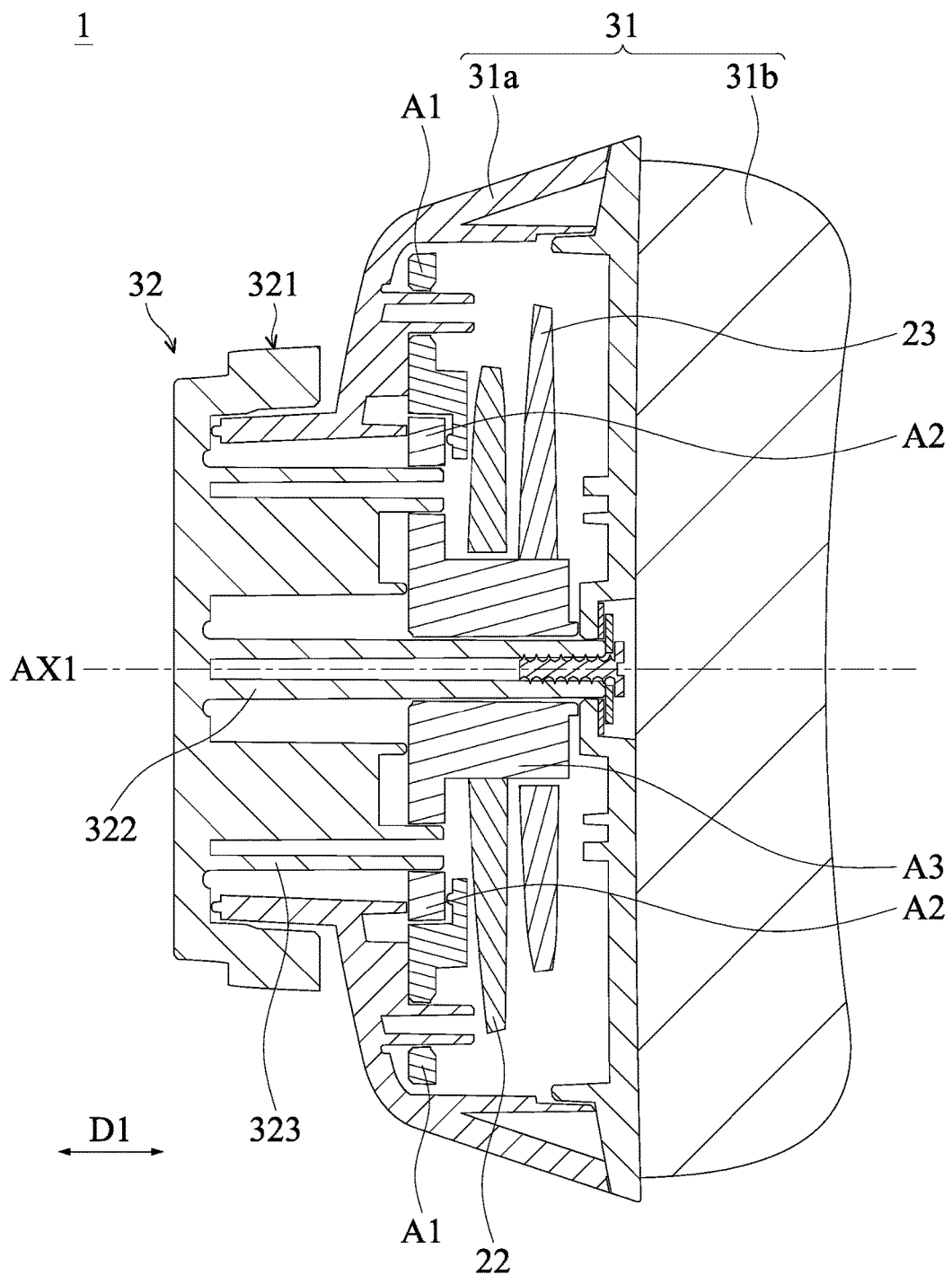
FIG. 3 is a cross-sectional view of the head-mounted display in accordance with the first embodiment of the disclosure.
Figure 4A:
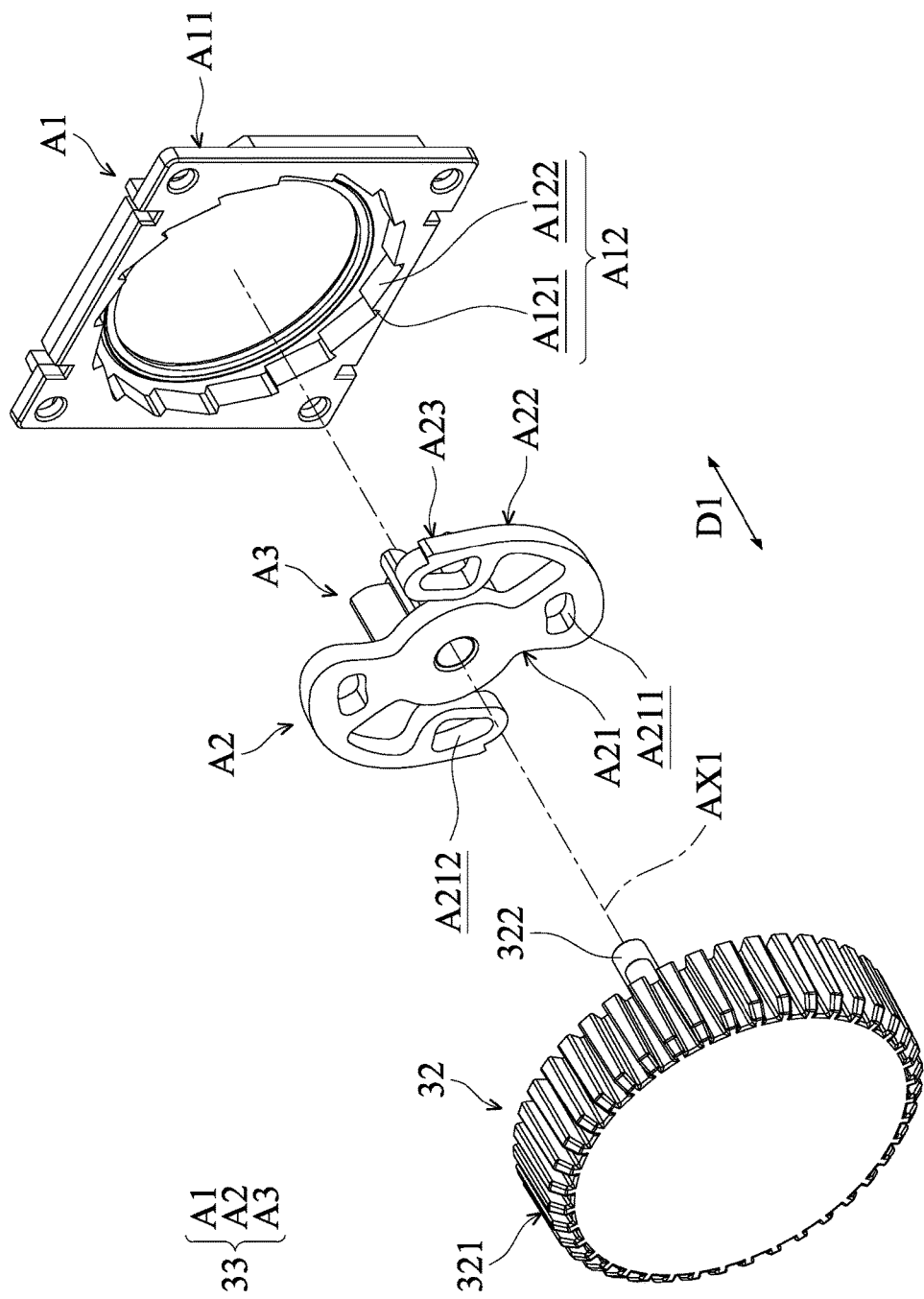
FIGS. 4A and 4B are perspective views of the rotation button and the adjusting mechanism in accordance with the first embodiment of the disclosure.
Figure 4B:
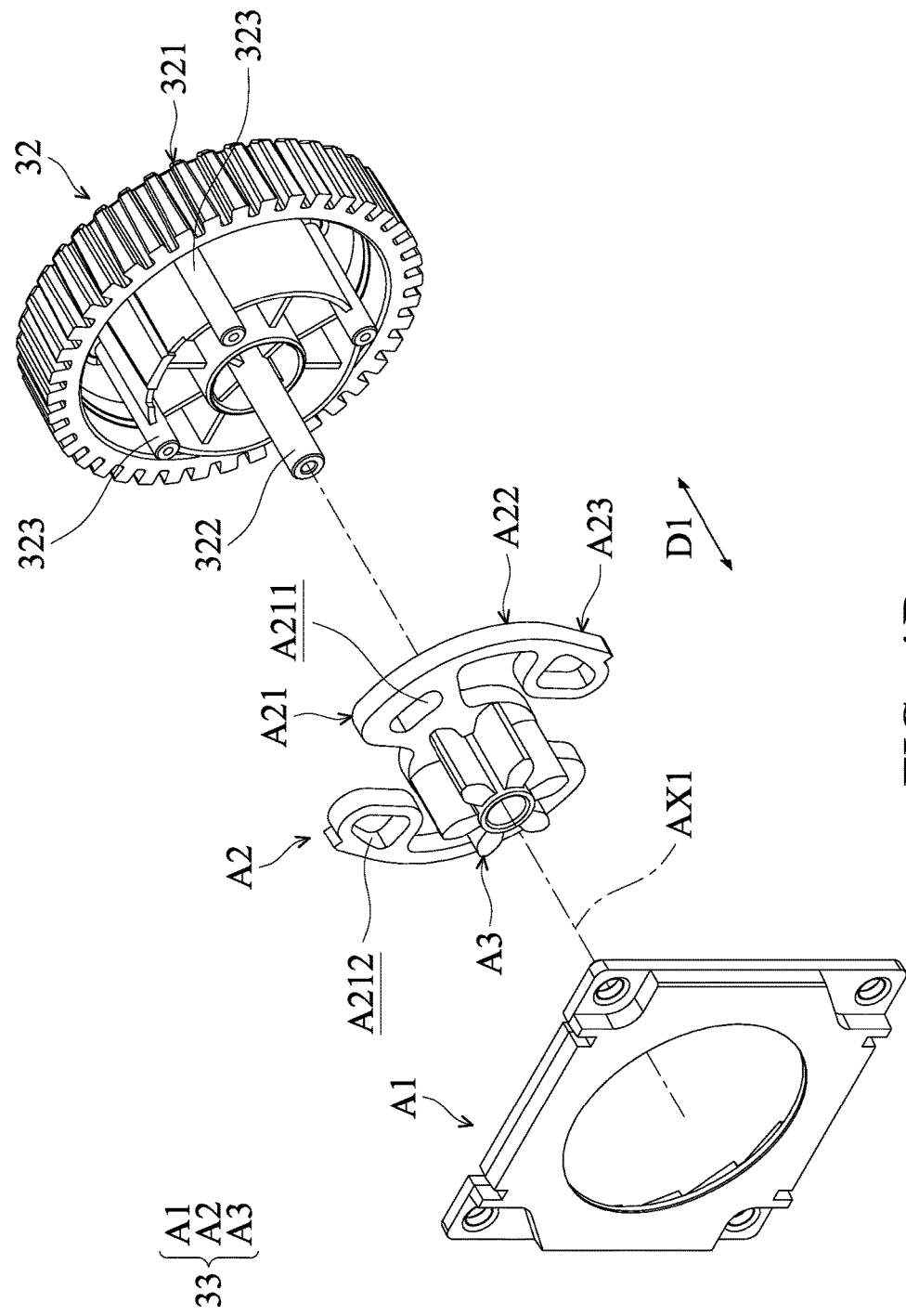

FIG. 3 is a cross-sectional view of the head-mounted display 1 in accordance with the first embodiment of the disclosure. In FIG. 3, the cross section is parallel to or passes through a rotation axis AX1. FIGS. 4A and 4B are perspective views of the rotation button 32 and the adjusting mechanism 33 in accordance with the first embodiment of the disclosure. The rotation button 32 is rotatably disposed on housing 31, and connected to the adjusting mechanism 33. When the rotation button 32 is rotated, the rotation button 32 drives the adjusting mechanism 33 to make the adjusting mechanism 33 change the distance between the first end 223 and the second end 233, and thus the length or size of the bonding structure 20 is changed.

The rotation button 32 includes a rotation body 321, a central shaft 322, and guiding elements 323. The rotation body 321 is rotatably disposed on the button base 312. The rotation body 321 can be rotated about a rotation axis AX1. In other words, the rotation axis AX1 passes through the center of the rotation body 321. The central shaft 322 is connected to the center of the rotation body 321. The central shaft 322 extends along the rotation axis AX1, and passes through the opening 311 of the first housing 31a. In this embodiment, one end of the central shaft 322 is pivoted to the second housing 31b.

The guiding element 323 extends along an extension direction D1, and passes through the opening 311. The guiding element 323 is arranged around the central shaft 322, and parallel to the central shaft 322. The extension direction D1 is parallel to the rotation axis AX1. In this embodiment, there are four guiding elements 323, but it is not limited thereto. In some embodiments, there are one, two, three, or at least five guiding elements 323.

The adjusting mechanism 33 is disposed in the housing 31, and connected to the first bonding band 22 and the second bonding band 23. The adjusting mechanism 33 includes an inner ratchet A1, a driving element A2, and a driving gear A3. The inner ratchet A1 is connected to the inner side of the first housing 31a, and corresponds to the opening 311 of the first housing 31a. In some embodiments, the inner ratchet A1 is affixed to the inner side of the first housing 31a. The inner ratchet A1 and the first housing 31a are formed as a single piece, and may be made of the same material, such as plastic.

The inner ratchet A1 may be a ring-like structure. The inner ratchet A1 includes a ring-like body A11 and blocking grooves A12. The central shaft 322 of the rotation button 32 and/or the guiding element 323 can pass through the inner side of the ring-like body A11. The blocking groove A12 is formed on the inner wall of the ring-like body A11. In other words, the blocking groove A12 is arranged around the rotation axis AX1 and the central shaft 322.

The driving element A2 is disposed in the inner ratchet A1, and connected to the rotation button 32. When the rotation button 32 is rotated, the rotation button 32 drives the driving element A2 to rotate relative to the inner ratchet A1. In this embodiment, the driving element A2 is located between the ring-like body A11 and the first housing 31a, and can be rotated between the ring-like body A11 and the first housing 31a. Therefore, the movement of the driving element A2 can be restricted by the ring-like body A11 and the first housing 31a.

The driving element A2 may be a plate structure extending perpendicular to the rotation axis AX1. The driving element A2 includes a driving body A21, elasticity arms A22, and blocking protrusions A23. The driving body A21 extends perpendicular to the rotation axis AX1, and the central shaft 322 and rotation axis AX1 pass through the center of the driving body A21. The driving body A21 includes position holes A211. Some of the ends of the guiding elements 323 extend into a position hole A211.

The elasticity arms A22 are connected to the driving body A21, and each of the elasticity arms A22 includes a guiding hole A212. The ends of the guiding elements 323 extend into the guiding holes A212. In some embodiments, the guiding holes A212, the position holes A211 and/or the guiding elements 323 are arranged in a ring path. The blocking protrusions A23 are connected to the elasticity arms A22. Therefore, when the rotation button 32 is rotated, the guiding elements 323 drive the driving element A2 to rotate relative to the inner ratchet A1.

The driving gear A3 is disposed on the driving element A2. In this embodiment, the driving gear A3 is rotated about the rotation axis AX1. The central shaft 322 of the rotation button 32 can pass through the center of the driving gear A3. The driving gear A3 can pass through the first guiding groove 221 of the first bonding band 22 and the second guiding groove 231 of the second bonding band 23. Moreover, the driving gear A3 meshes with the first gear rack 222 and the second gear rack 232. Therefore, when the rotation button 32 is rotated, the adjusting mechanism 33 drives the driving gear A3 to rotate, and the first bonding band 22 and the second bonding band 23 are moved by the driving gear A3.

In this embodiment, the driving gear A3 and the driving element A2 are formed as a single piece, and are made of the same material, such as plastic. In some embodiments, the driving gear A3 and the driving element A2 are individual elements. The driving gear A3 can assemble with or affixed to the driving element A2.

Figure 5A:
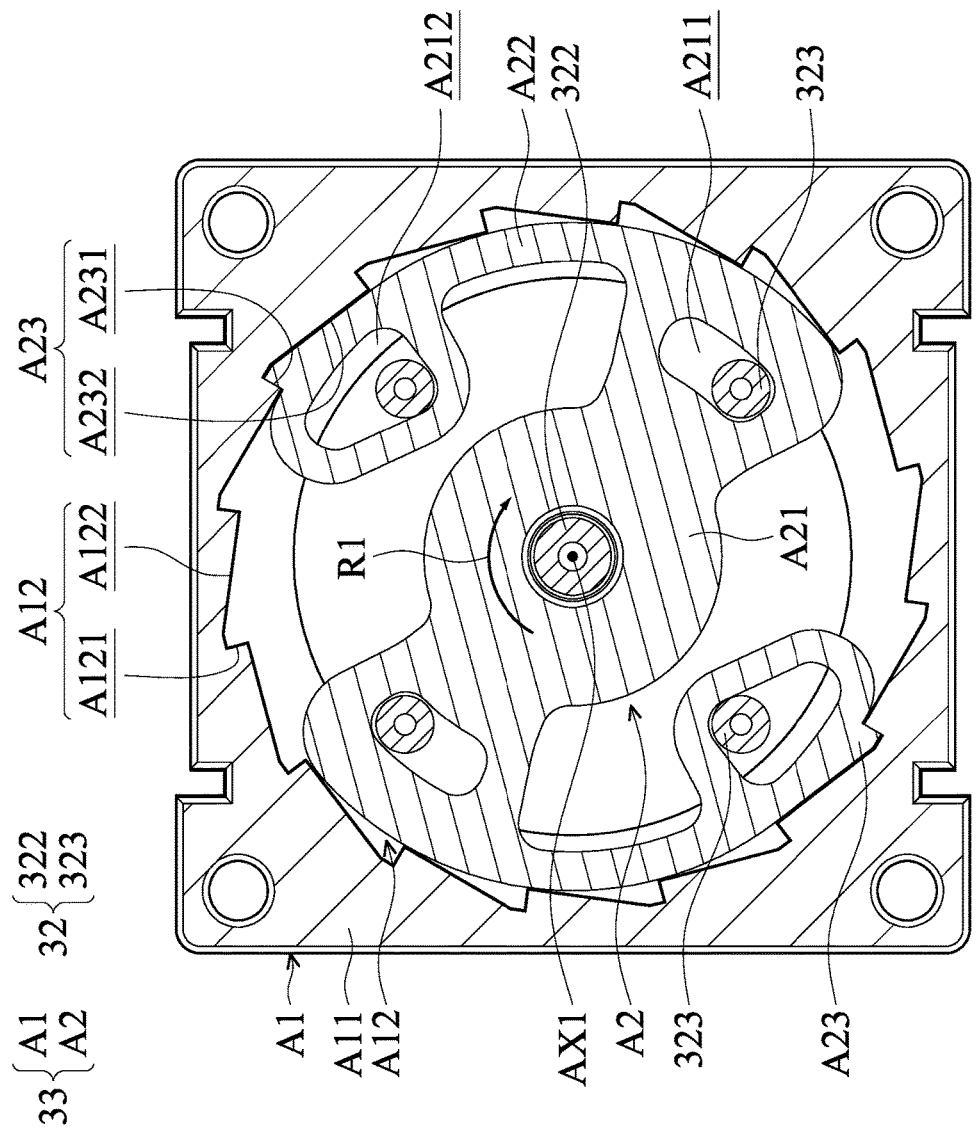
FIGS. 5A and 5B are cross-sectional views of the rotation button and the adjusting mechanism in accordance with the first embodiment of the disclosure.
Figure 5B:
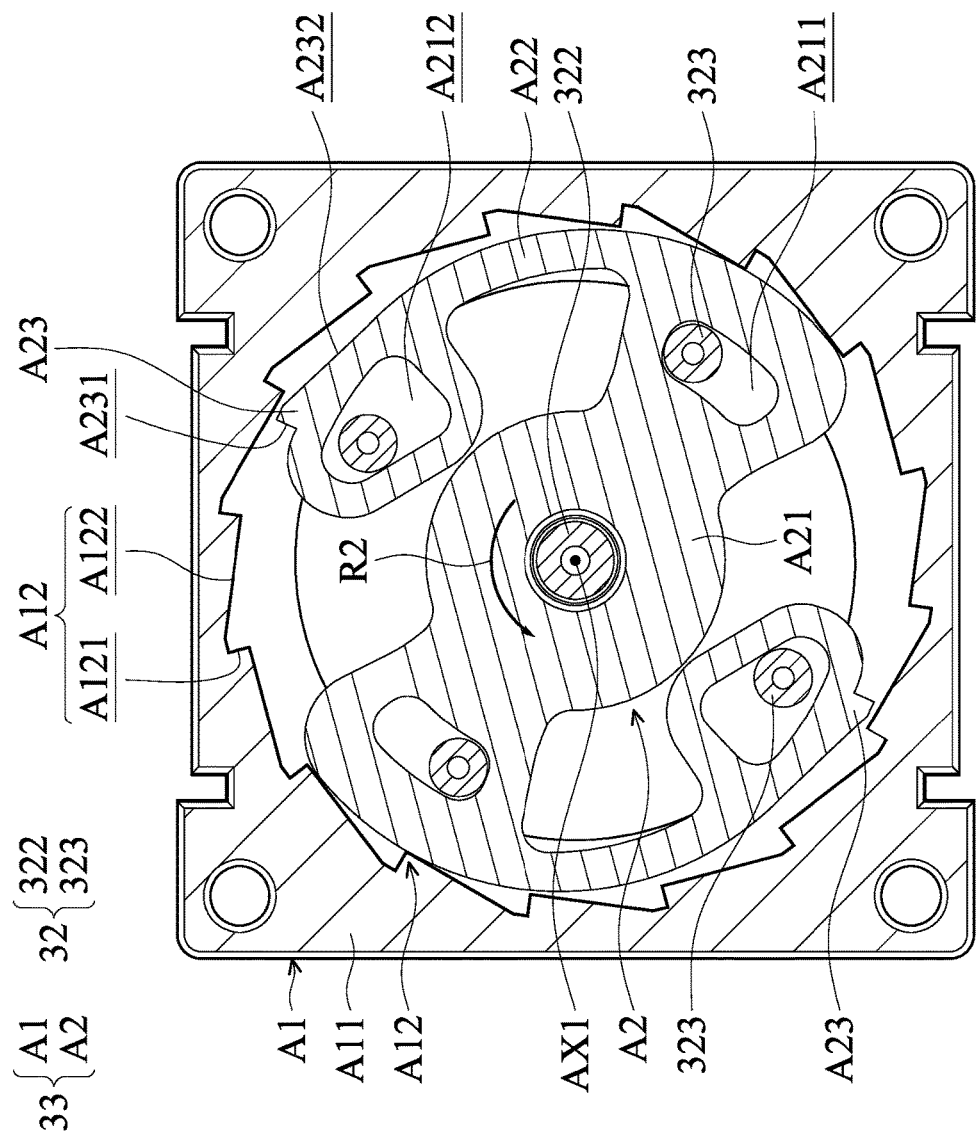
Figure 6:
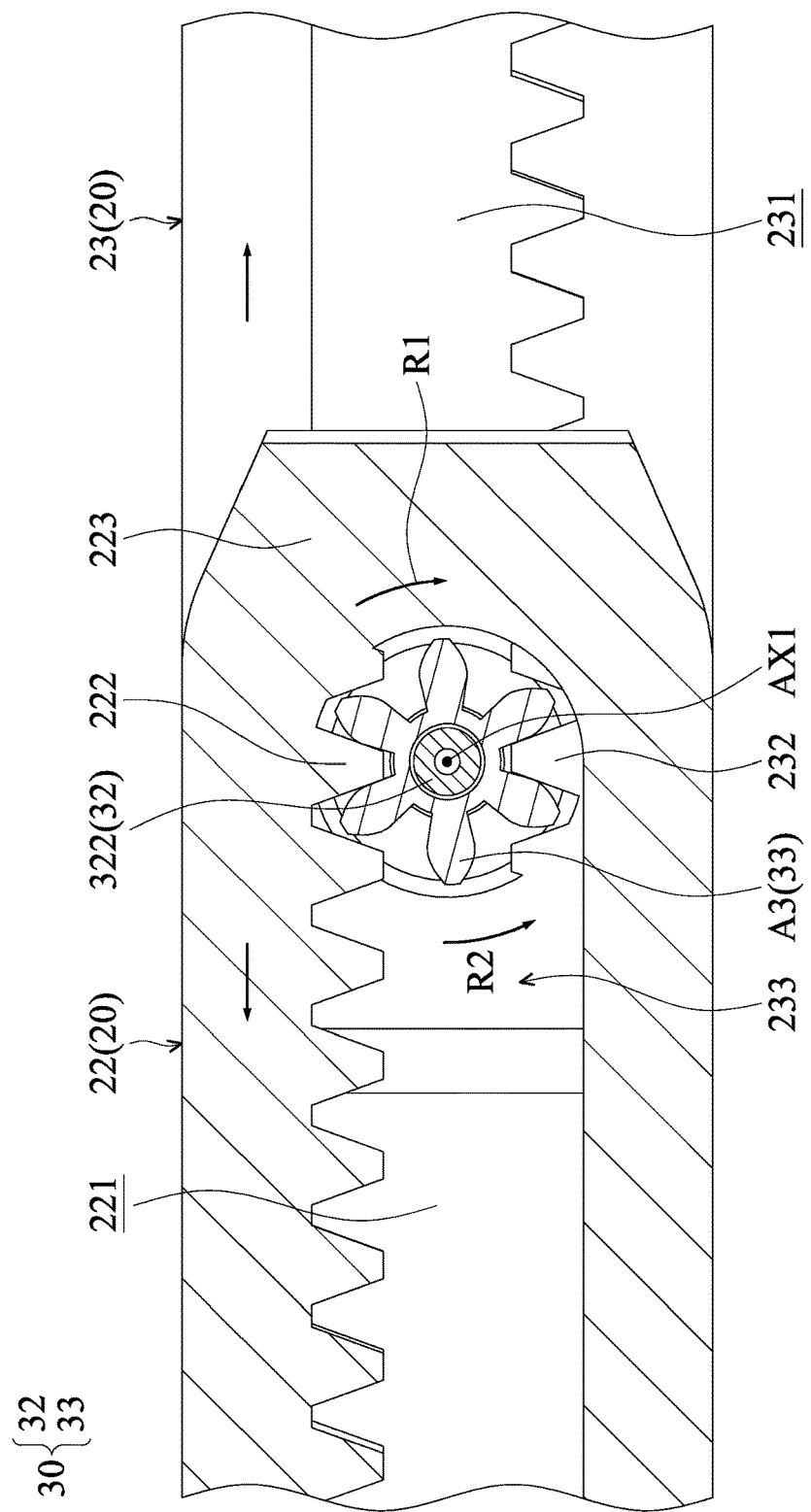
FIG. 6 is a cross-sectional view of the bonding structure and the adjusting mechanism in accordance with the first embodiment of the disclosure.

FIGS. 5A and 5B are cross-sectional views of the rotation button 32 and the adjusting mechanism 33 in accordance with the first embodiment of the disclosure. In FIGS. 5A and 5B, the cross sections are perpendicular to the rotation axis AX1. FIG. 6 is a cross-sectional view of the bonding structure 20 and the adjusting mechanism 33 in accordance with the first embodiment of the disclosure. In FIG. 6, the cross section is perpendicular to the rotation axis AX1. Each of the blocking protrusions A23 includes a first blocking surface A231 and a first inclined surface A232 connected to the first blocking surface A231. The first blocking surfaces A231 substantially extend toward the rotation axis AX1. The first inclined surfaces A232 are inclined relative to the first blocking surfaces A231.

Each of the blocking grooves A12 includes a second blocking surface A121 and a second inclined surface A122 connected to the second blocking surface A121. The second blocking surfaces A121 substantially extend toward the rotation axis AX1. The second inclined surfaces A122 are inclined relative to the second blocking surfaces A121. When the blocking protrusions A23 are located in the blocking grooves A12, the first blocking surfaces A231 correspond to the second blocking surfaces A121, and the first inclined surfaces A232 correspond to the second inclined surfaces A122. As shown in FIG. 5A, the first blocking surfaces A231 are connected to the second blocking surfaces A121, and the first inclined surfaces A232 are connected to the second inclined surfaces A122.

When the rotation button 32 is rotated in a first rotation direction R1, the guiding elements 323 of the rotation button 32 pushes the driving element A2 to rotate in the position holes A211 and the guiding holes A212. Due to the elastic force of the elasticity arm A22, the first inclined surfaces A232 slide along the second inclined surfaces A122 so as to make the driving element A2 rotate in the first rotation direction R1 relative to the inner ratchet A1.

Moreover, as shown in FIG. 6, since the driving gear A3 is affixed to the driving element A2, the driving gear A3 is rotated in the first rotation direction R1. By the driving gear A3 rotating in the first rotation direction R1, the first bonding band 22 is moved relative to the second bonding band 23, and thus the distance between the first end 223 and the second end 233 is changed.

In this case, during the rotation button 32 rotating in the first rotation direction R1, the distance between the first end 223 and the second end 233 is gradually increased. In other words, the overlapped portions of the first bonding band 22 and the second bonding band 23 are increased. Thus, the length or size of the bonding structure 20 is decreased, and the head-mounted display 1 can be stably worn on the user's head.

Moreover, when the rotation button 32 is not rotated and the first bonding band 22 and/or the second bonding band 23 are pulled, the driving element a2 is prevented from rotating in a second rotation direction r2, which is opposite the first rotation direction r1, relative to the inner ratchet a1 since the first blocking surface a231 abuts the second blocking surface a121. In other words, because of the blocking protrusion a23 of the driving element a2 and the blocking groove a12 of the inner ratchet a1, the first end 223 is prevented from moving relative to the second end 233, and is allowed to be located far away from the second end 233 when the rotation button 32 is not being rotated. Therefore, when the rotation button 32 is not rotating, the length or size of the bonding structure 20 is prevented from increasing, and the head-mounted display 1 is prevented from falling off of the user's head.

When the rotation button 32 is rotated in the second rotation direction R2, the guiding elements 323 of the rotation button 32 in the guiding holes A212 push the elasticity arms A22 toward the center of the driving body A21. Moreover, the first blocking surfaces A231 slide to the center of the driving body A21 along the second blocking surfaces A121, and thus the blocking protrusions A23 are out of the blocking grooves A12. Therefore, the driving element A2 can be rotated in the second rotation direction R2 relative to the inner ratchet A1.

Moreover, as shown in FIG. 6, since the driving gear A3 is affixed to the driving element A2, the driving gear A3 is rotated along the second rotation direction R2. Due to the driving gear A3 being rotated in the second rotation direction R2, the first bonding band 22 is moved relative to the second bonding band 23, and thus the distance between the first end 223 and second end 233 changes.

In this case, during the rotation button 32 rotating in the second rotation direction R2, the distance between the first end 223 and the second end 233 is gradually deceased, and the first end 223 and the second end 233 are overlapped. In other words, the overlapped portions of the first bonding band 22 and the second bonding band 23 are decreased, and thus the length or size of the bonding structure 20 is increased, and the head-mounted display 1 can be easily removed from the user's head.

Accordingly, in this embodiment, the user can rotate the rotation button 32 with one hand to change the length or size of the bonding structure 20, and can easily wear the head-mounted display 1 on the head or remove the head-mounted display 1 from the head.

Figure 7:
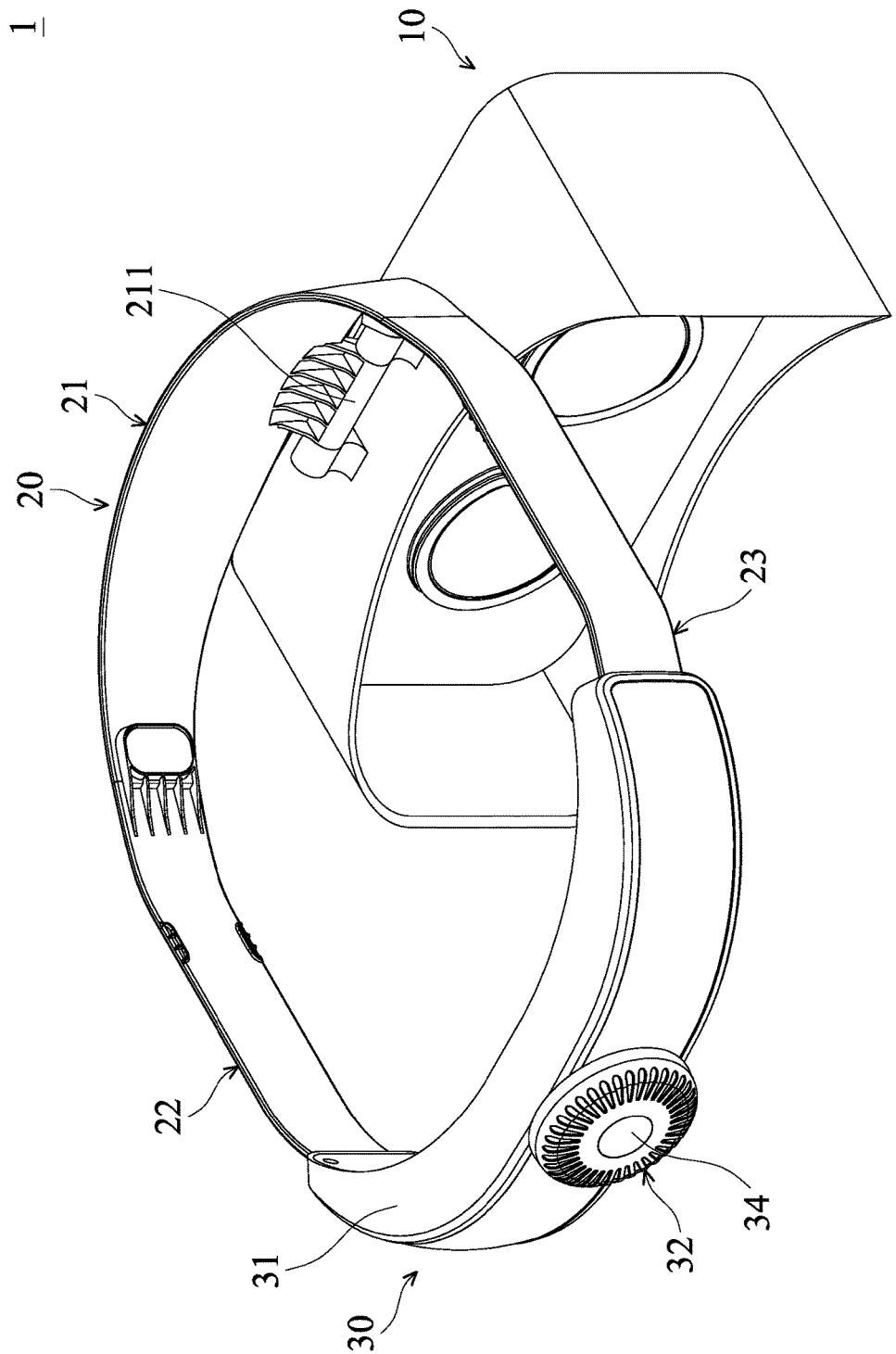
FIG. 7 is a perspective view of a head-mounted display in accordance with a second embodiment of the disclosure.
Figure 8:
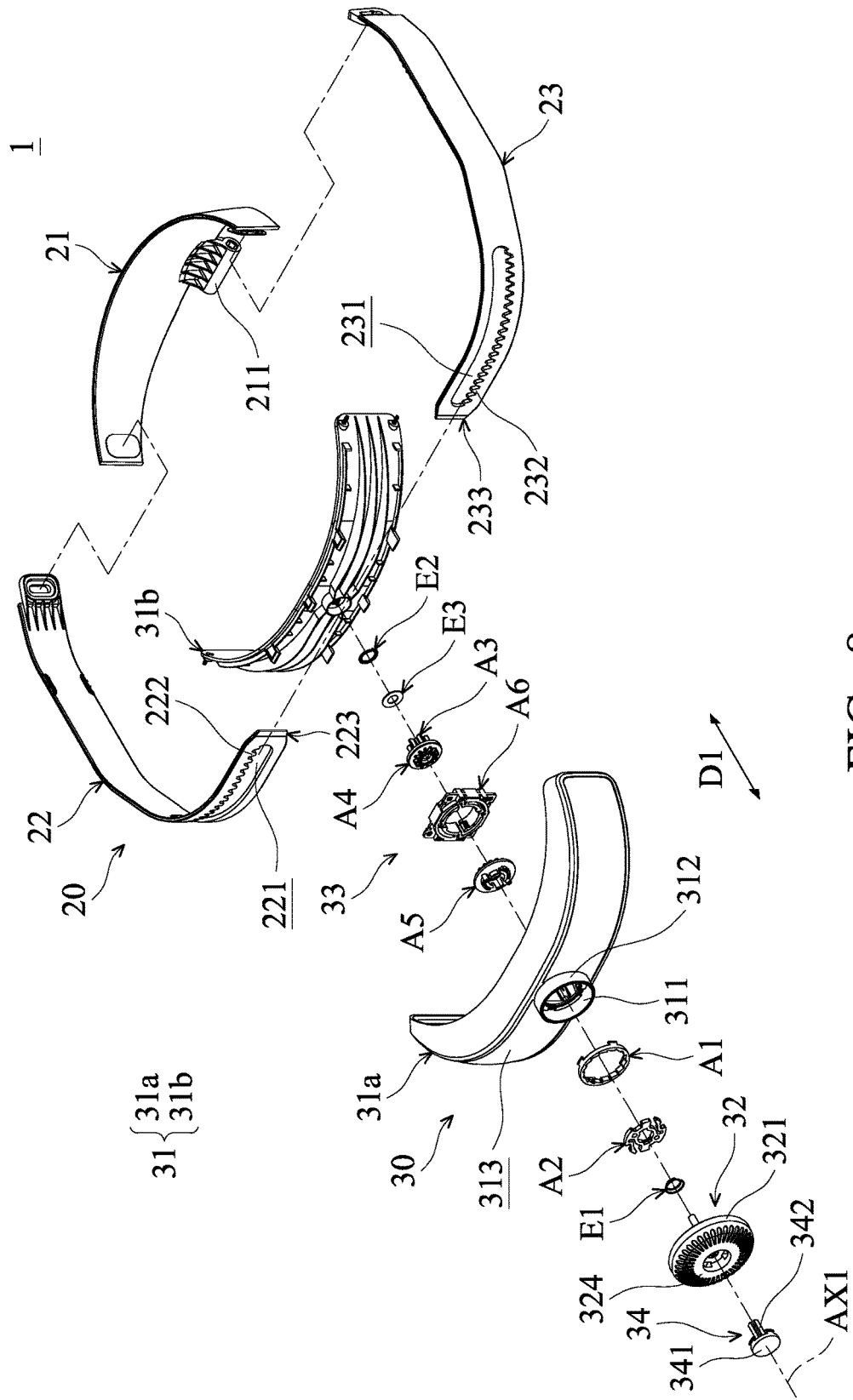
FIG. 8 is an exploded view of the head-mounted display in accordance with the second embodiment of the disclosure, wherein the display device is not illustrated.

FIG. 7 is a perspective view of a head-mounted display 1 in accordance with a second embodiment of the disclosure. FIG. 8 is an exploded view of the head-mounted display 1 in accordance with the second embodiment of the disclosure. For clarity, the display device 10 is no illustrated in FIG. 8.

Figure 9A:
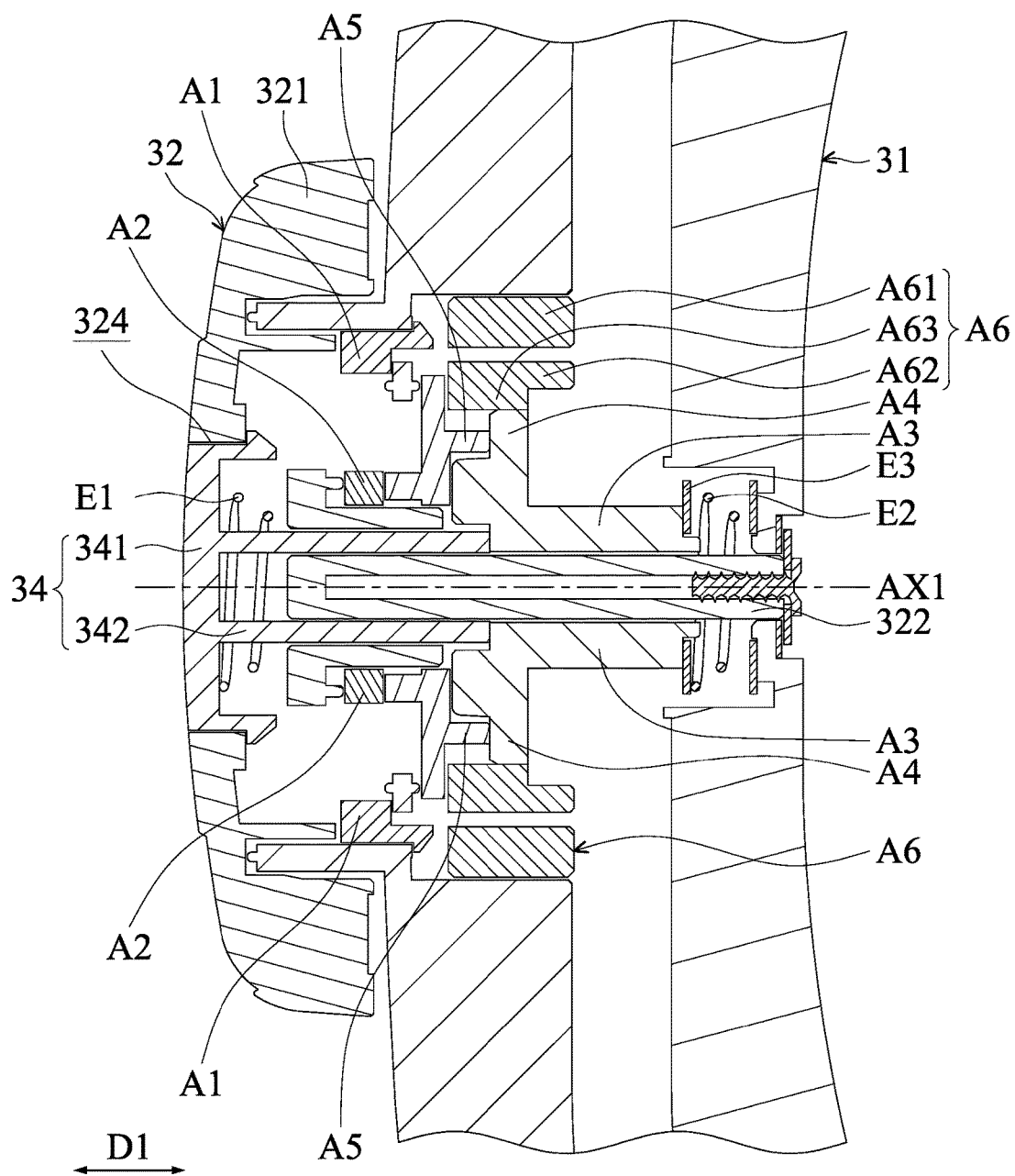
FIGS. 9A and 9B are cross-sectional views of the head-mounted display in accordance with the second embodiment of the disclosure.
Figure 9B:
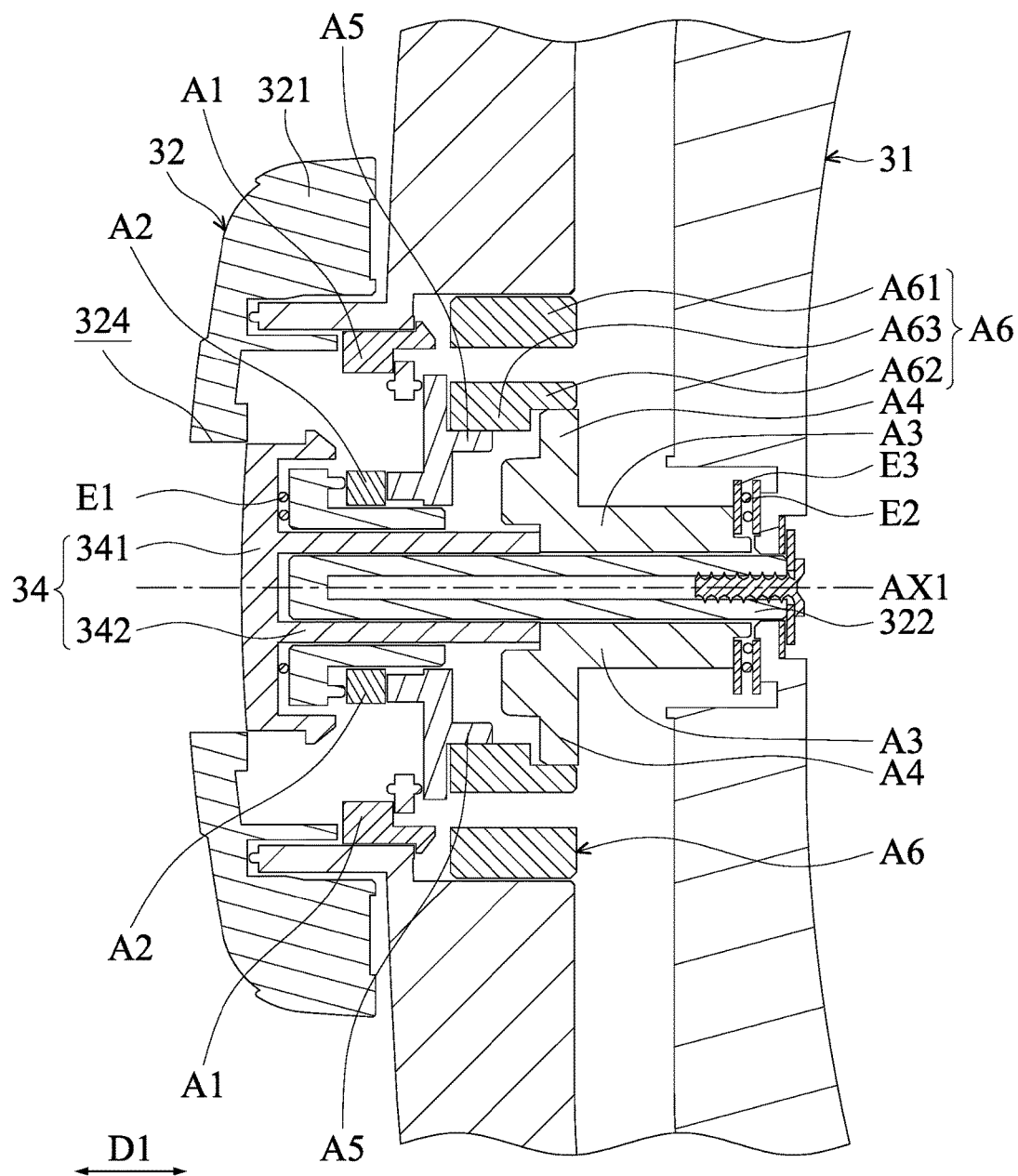
Figure 10A:
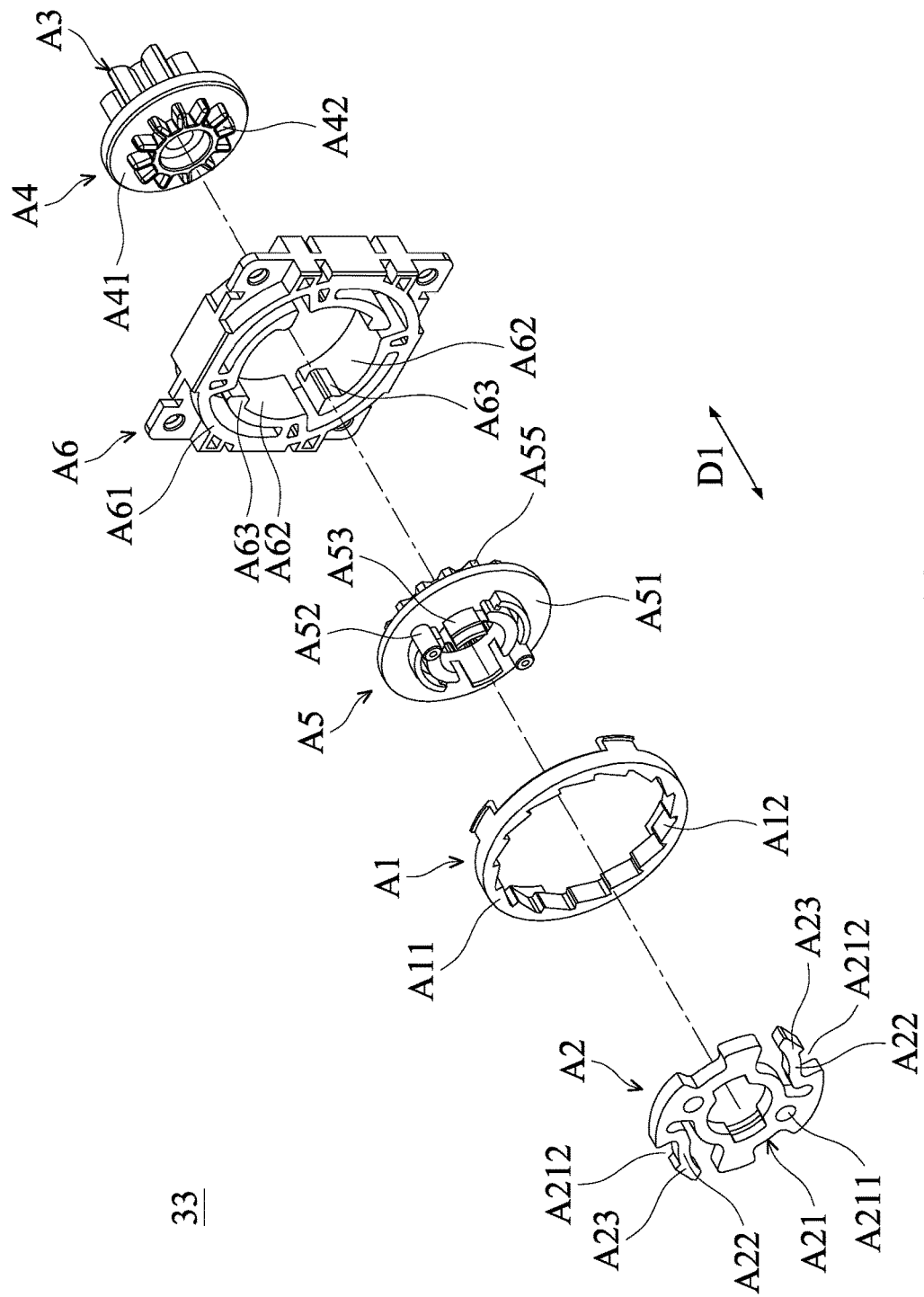
FIGS. 10A and 10B are perspective views of the adjusting mechanism in accordance with the second embodiment of the disclosure.
Figure 10B:
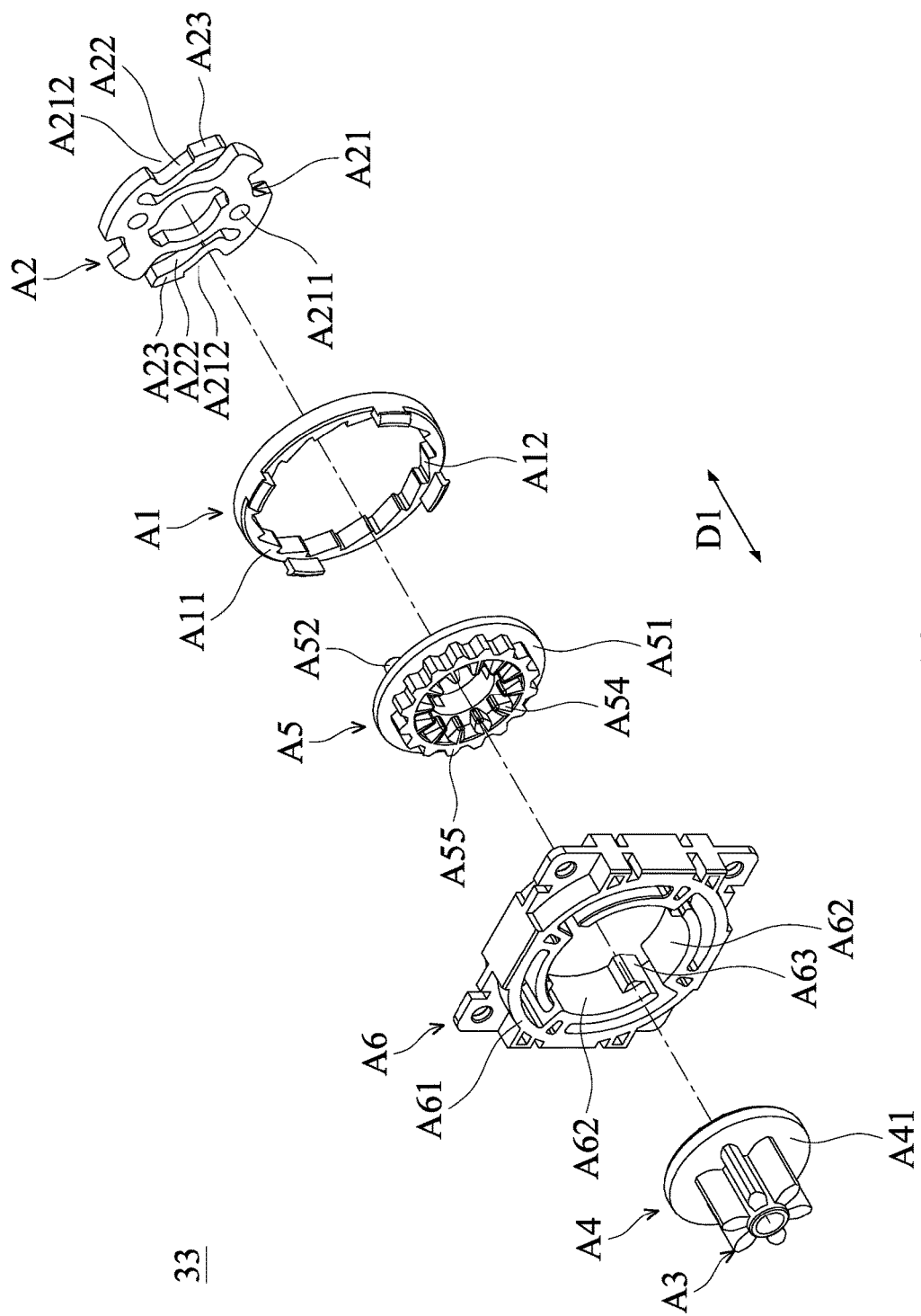

FIGS. 9A and 9B are cross-sectional views of the head-mounted display 1 in accordance with the second embodiment of the disclosure. In FIG. 9A, the button 34, the first rotary disk A4, and the driving gear A3 are located at an initial position. In FIG. 9B, the button 34, the first rotary disk A4, and the driving gear A3 are located at a pressing location. FIGS. 10A and 10B are perspective views of the adjusting mechanism 33 in accordance with the second embodiment of the disclosure.

The adjusting device 30 further includes a button 34. The button 34 is movably disposed on the rotation button 32. In this embodiment, the rotation axis AX1 passes through the center of the button 34, and the button 34 can be moved along the rotation axis AX1 or the extension direction D1. The button 34 includes a cap 341 and one or more pressing portions 342. The cap 341 is movably disposed in a receiving groove 324 of the rotation body 321 of the rotation button 32. The receiving groove 324 of the rotation body 321 is aligned to the rotation axis AX1. The pressing portions 342 are disposed on the cap 341, and extend along the extension direction D1. The pressing portions 342 pass through the rotation body 321, and are arranged around the central shaft 322. In other words, the pressing portions 342 are parallel to the central shaft 322.

The pressing portion 342 of the button 34 is connected to the adjusting mechanism 33. In FIG. 9A, the button 34 is located at the initial position. In FIG. 9B, after the button 34 is pressed to the pressing location, the adjusting mechanism 33 allows the first end 223 to move relative to the second end 233. In other words, the length or size of the bonding structure 20 can be greatly adjusted by pressing the button 34.

In this embodiment, the adjusting mechanism 33 further includes an elastic element E1 disposed between the cap 341 and the rotation body 321. The elastic element E1 is configured to provide an elastic force to the button 34 to make the button 34 move from the pressing location to the initial position.

The shapes of the inner ratchet A1 and the driving element A2 in the second embodiment are different from the shapes of the inner ratchet A1 and the driving element A2 in the first embodiment. The inner ratchet A1 and the driving element A2 can be disposed on the outer side of the first housing 31a, and can be located in the button base 312.

Moreover, the driving gear A3 is not directly connected to the driving element A2. The driving gear A3 can be moved along the rotation axis AX1. When the button 34 is pressed, the button 34 and the driving gear A3 are located at the pressing location.

In this embodiment, the adjusting mechanism 33 further includes an elastic element E2 disposed in the housing 31, and located between the driving gear A3 and the second housing 31b. The elastic element E2 is configured to provide an elastic force to the driving gear A3. When the rotation button 32 is rotated, the elastic element E2 moves the driving gear A3 and/or the button 34 from the pressing location to the initial position.

In this embodiment, the adjusting mechanism 33 further includes a pad E3 located between the elastic element E2 and the driving gear A3. The driving gear A3 can be smoothly rotated relative to the elastic element E2 by the pad E3. The pad E3 can prevent the elastic element from scratching the driving gear A3.

In this embodiment, the adjusting mechanism 33 further includes a first rotary disk A4, a second rotary disk A5, and a switching structure A6. The first rotary disk A4 is disposed on the driving gear A3, and can be selectively connected to or disengaged from the second rotary disk A5. The first rotary disk A4 can be rotated about the rotation axis AX1. The first rotary disk A4 includes a first disk body A41 and a first gear A42. The first disk body A41 extends perpendicular to the rotation axis AX1. The central shaft 322 of the rotation button 32 passes through the center of the first disk body A41 and the first gear A42.

The driving gear A3 is disposed on one side of the first disk body A41, and the first gear A42 is disposed on the opposite side of the first disk body A41. In other words, the first disk body A41 is located between the first gear A42 and the driving gear A3. In some embodiments, the first disk body A41, the first gear A42, and the driving gear A3 are formed as a single piece.

The second rotary disk A5 is connected to the driving element A2 and/or the rotation button 32. The second rotary disk A5 is rotated about the rotation axis AX1. The second rotary disk A5 includes a second disk body A51, a locking element A53, a position post A52, a second gear A54, and a third gear A55. In some embodiments, the second disk body A51, the locking element A53, the position post A52, the second gear A54, and the third gear A55 are formed as a single piece.

The second disk body A51 extends perpendicular to the rotation axis AX1. The locking element A53 and the position post A52 are disposed on one side of the second disk body A51, and the second gear A54 and a third gear A55 are disposed on the opposite side of the second disk body A51.

The locking element A53 is locked on the driving element A2, and the position post A52 extends into the position hole A211 of the driving element A2. Therefore, the second rotary disk A5 can be assembled to the driving element A2 by the locking element A53 and the position post A52. In some embodiments, the second rotary disk A5 and the driving element A2 are formed as a single piece.

The central shaft 322 of the rotation button 32 passes through the centers of the second disk body A51, the second gear A54, and the third gear A55. The second gear A54 can selectively mesh with first gear A42, or be disengaged from the first gear A42. The third gear A55 is surrounding the second gear A54.

In this embodiment, the pressing portion 342 of the button 34 is selectively connected to the first rotary disk A4. After the button 34 is pressed, the pressing portion 342 of the button 34 pushes the first rotary disk A4 and the driving gear A3, and thus the first gear A42 of the first rotary disk A4 is disengaged from the second gear A54 of the second rotary disk A5. Moreover, since the rotation of the first rotary disk A4 and the driving gear A3 are not limited by the second rotary disk A5, the first bonding band 22 and the second bonding band 23 can be greatly pulled. Therefore, the length or size of the bonding structure 20 can be quickly adjusted, and the time of donning and removing the head-mounted display 11 can be decreased.

The switching structure A6 is surrounding the first rotary disk A4 and the second rotary disk A5. In some embodiments, the switching structure A6 is surrounding the first gear A42, the second disk body A51, and the second gear A54. The switching structure A6 includes a switching body A61, switching arms A62, and switching protrusions A63. The switching body A61 may be a ring-like structure. The rotation axis AX1 and the central shaft 322 pass through the center of the switching body A61.

The switching arm A62 extends from the inner wall of the switching body A61. The switching arms A62 substantially extends along a circular path. In this embodiment, the diameter of the circular path is substantially equal to the diameter of the first disk body A41. The diameter of the second disk body A51 is greater than the diameter of the circular path.

The switching protrusion A63 is disposed on the inner side of the switching arm A62, and is configured to selectively prevent the first gear A42 from meshing with the second gear A54. The third gear A55 of the second rotary disk A5 is configured to selectively move the switching protrusion A63 to a connection position or a separation position.

Figure 11A:
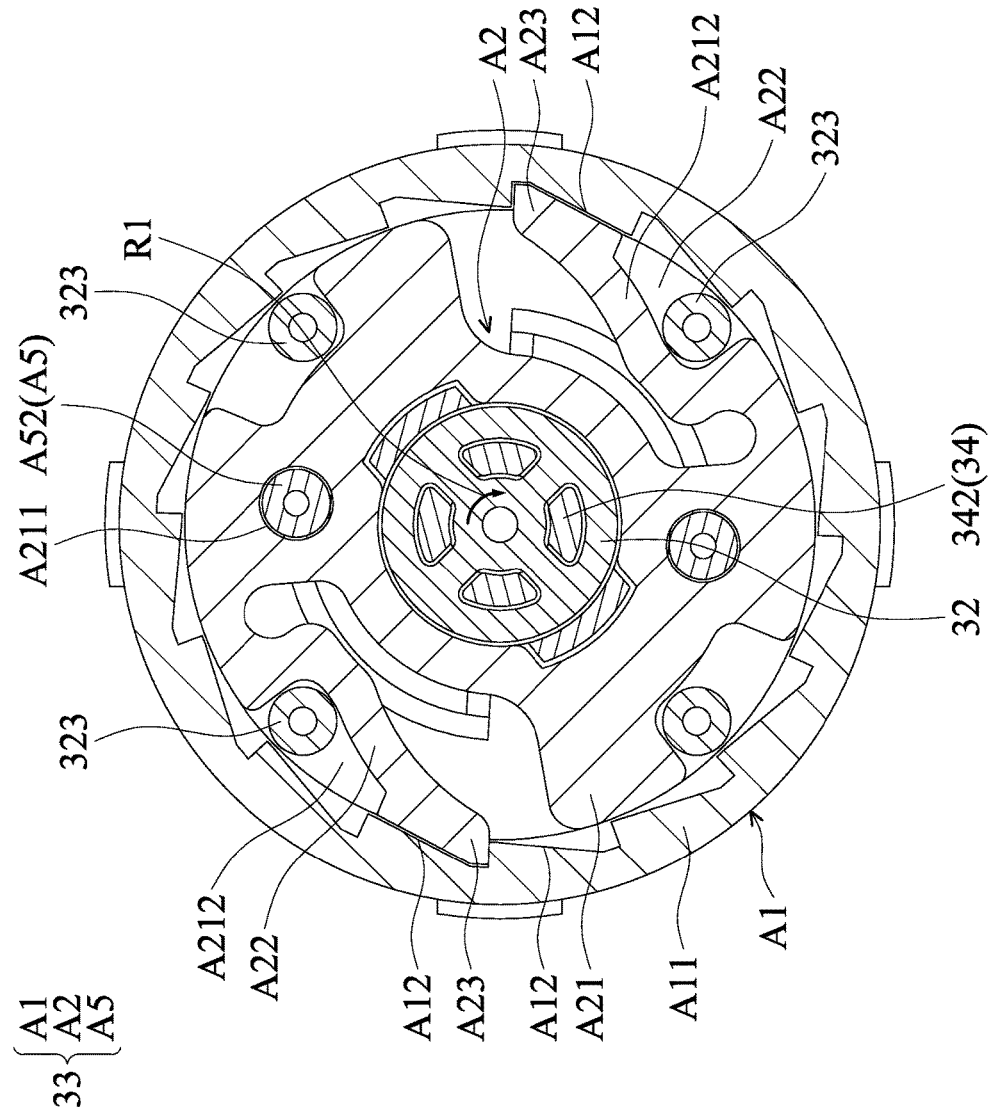
FIGS. 11A and 11B are cross-sectional views of the rotation button and the adjusting mechanism in accordance with the second embodiment of the disclosure.
Figure 11B:
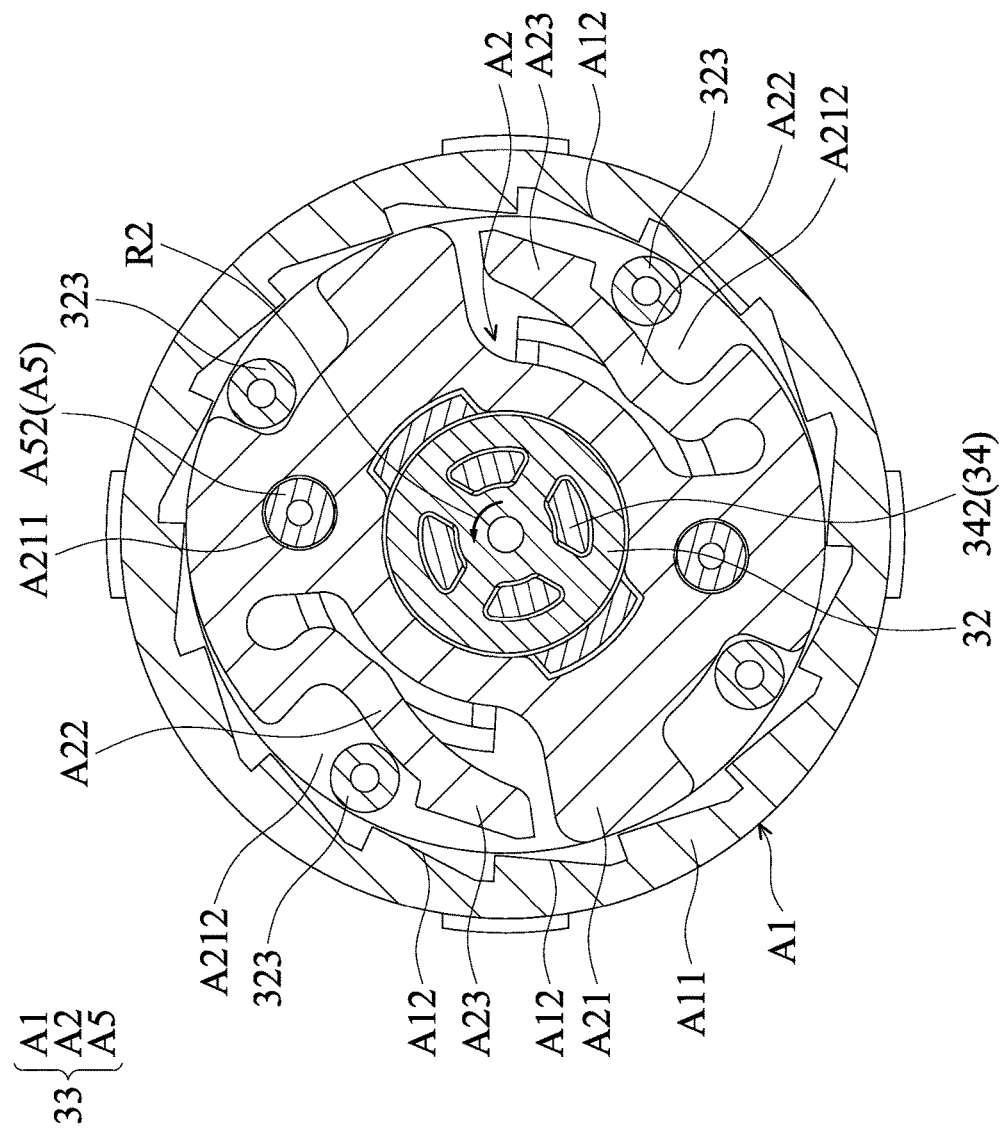

FIGS. 11A and 11B are cross-sectional views of the rotation button 32 and the adjusting mechanism 33 in accordance with the second embodiment of the disclosure. In FIGS. 11A and 11B, the cross sections are perpendicular to the rotation axis AX1. As shown in FIGS. 9A and 11A, when the first rotary disk A4 and the driving gear A3 are located at the initial position, the first rotary disk A4 is connected to the second rotary disk A5. When the rotation button 32 is rotated in a first rotation direction R1, the guiding element 323 of the rotation button 32 in the guiding hole A212 pushes the driving element A2 to rotate. Therefore, the driving element A2 can be rotated in the first rotation direction R1 relative to the inner ratchet A1.

Since the driving element A2 is affixed to the second rotary disk A5, the second rotary disk A5 meshes with the first rotary disk A4, and the first rotary disk A4 is affixed to the driving gear A3, the driving element A2 can drive the second rotary disk A5, the first rotary disk A4 and the driving gear A3 to rotate in the first rotation direction R1. Therefore, the first end 223 of the first bonding band 22 is located far away from the second end 233 of the second bonding band 23, and the length or size of the bonding structure 20 is decreased.

As shown in FIG. 11B, wherein the rotation button 32 is rotated in the second rotation direction R2, the guiding element 323 of the rotation button 32 in the guiding hole A212 pushes the elasticity arm A22 toward the center of the driving body A21 so as to remove the blocking protrusion A23 from the blocking groove A12. Therefore, the driving element A2 can be rotated in the second rotation direction R2 relative to the inner ratchet A1.

Since the driving element A2 is affixed to the second rotary disk A5, the second rotary disk A5 meshes with the first rotary disk A4, and the first rotary disk A4 is affixed to the driving gear A3, the driving element A2 can drive the second rotary disk A5, the first rotary disk A4 and the driving gear A3 to rotate in the second rotation direction R2. Therefore, the first end 223 of the first bonding band 22 is moved toward the second end 233 of the second bonding band 23, and thus the length or size of the bonding structure 20 is increased.

Moreover, when the first rotary disk A4, the driving gear A3, and/or the button 34 are located at the initial position, and the rotation button 32 is not rotated, the adjusting mechanism 33 prevents the first end 223 from moving toward the second end 233, and allows the first end 223 to be located far away from the second end 233. In other words, when the rotation button 32 is not rotated, the length or size of the bonding structure 20 is prevented from increasing, and the head-mounted display 1 is prevented from falling off of the user's head.

Figure 12A:
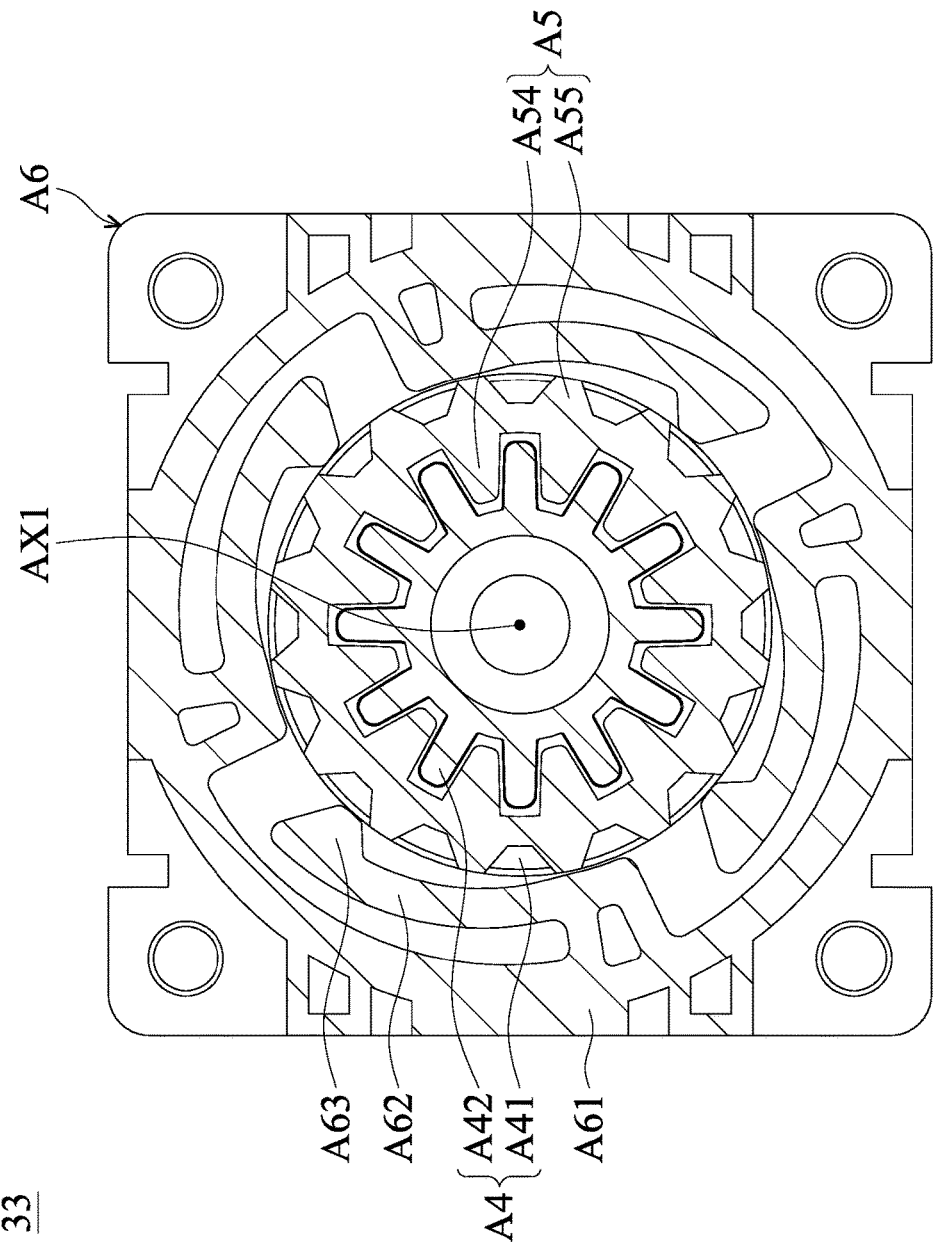
FIG. 12A is a cross-sectional view of the adjusting mechanism in accordance with the second embodiment of the disclosure.
Figure 12:
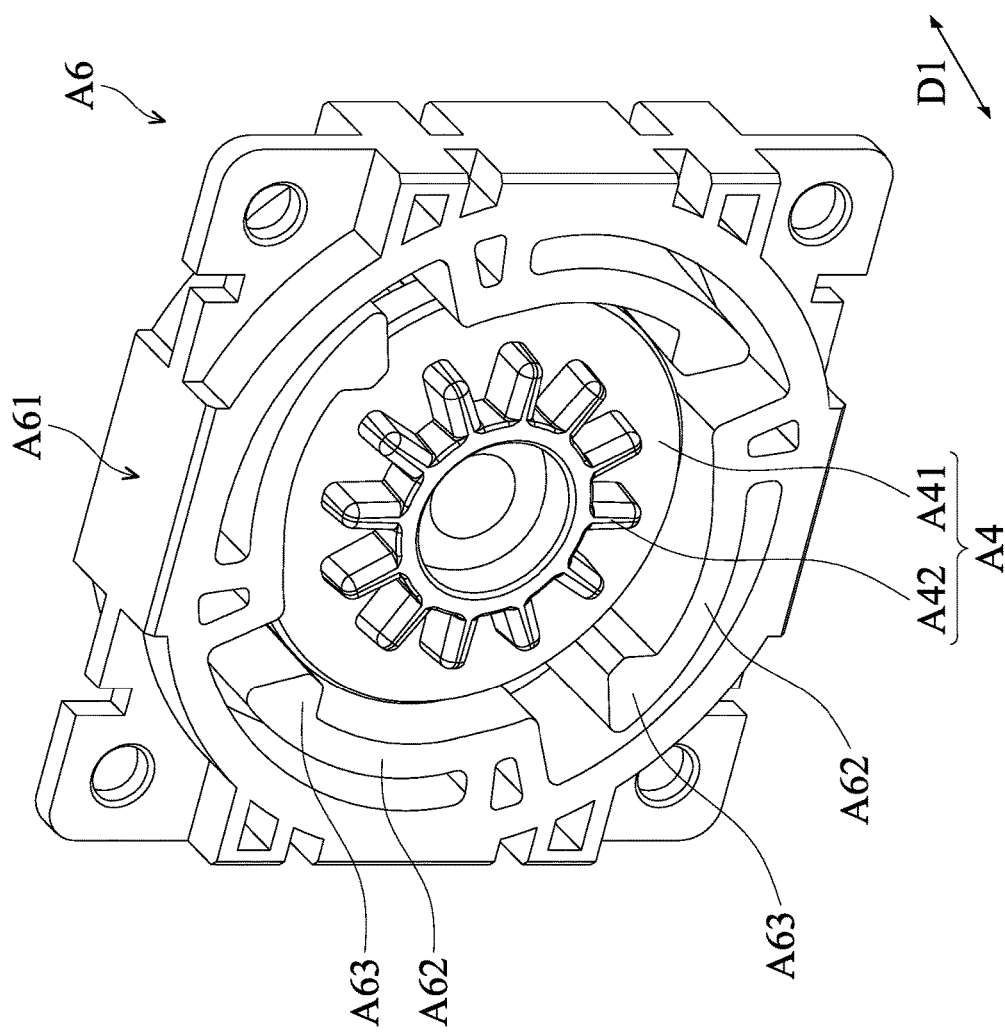
FIG. 12B is a perspective view of the first rotary disk and the switching structure in accordance with the second embodiment of the disclosure.

FIG. 12A is a cross-sectional view of the adjusting mechanism 33 in accordance with the second embodiment of the disclosure. In FIG. 12, the cross section is parallel to or passes through the rotation axis AX1. FIG. 12B is a perspective view of the first rotary disk A4 and the switching structure A6 in accordance with the second embodiment of the disclosure. When the first rotary disk A4 and the driving gear A3 are located at the initial position, the edge of the first disk body A41 pushes the switching protrusion A63 to a connection position. Moreover, the elastic element E2 (as shown in FIG. 9A) is configured to provide an elastic force to make the first gear A42 mesh with the second gear A54. In other words, when the switching protrusion A63 is located at the connection position, the first gear A42 meshes with the second gear A54.

Figure 13:
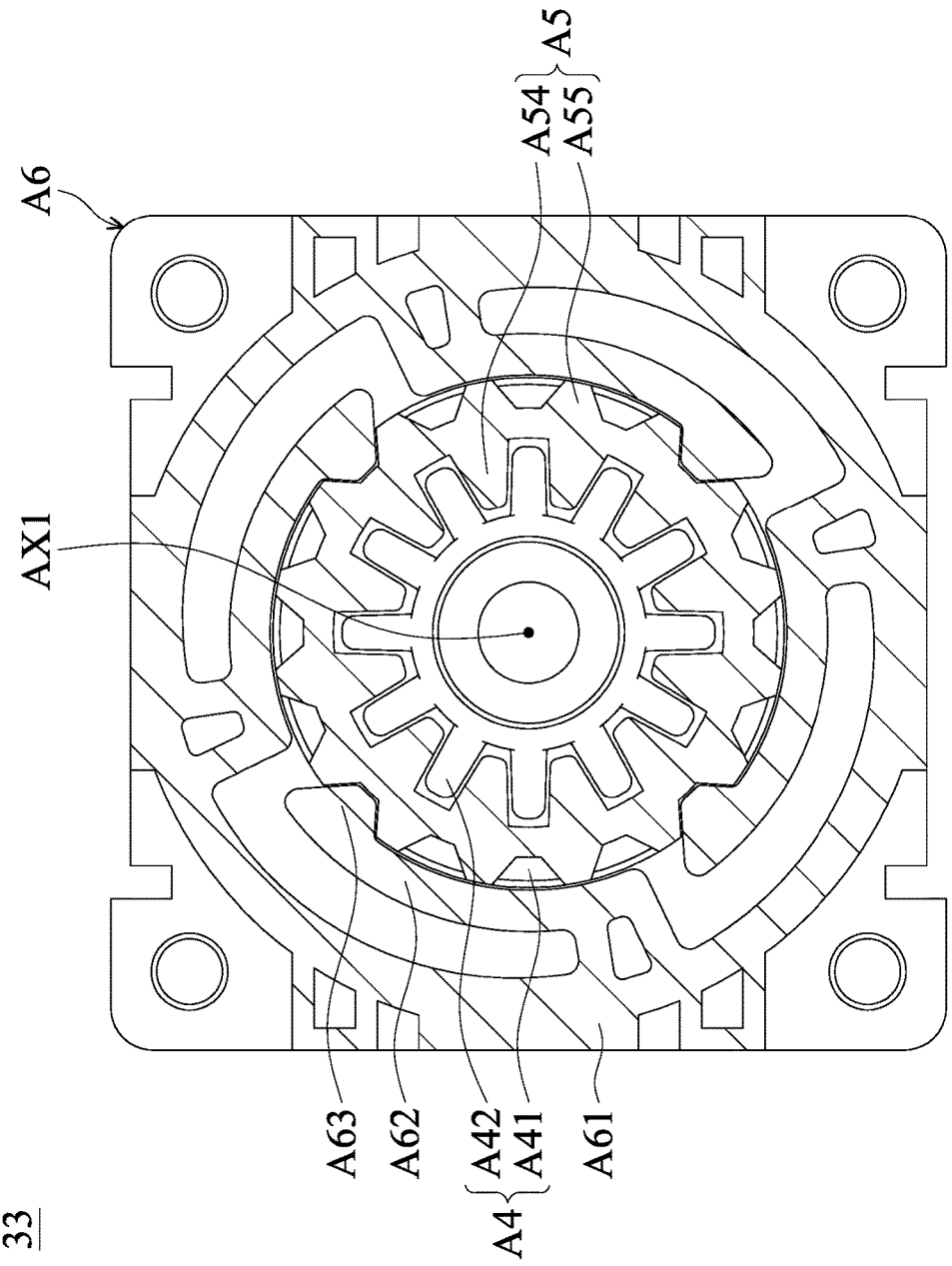
FIG. 13A is a cross-sectional view of the adjusting mechanism in accordance with the second embodiment of the disclosure.
FIG. 13B is a perspective view of the first rotary disk and the switching structure in accordance with the second embodiment of the disclosure.
Figure 13B:
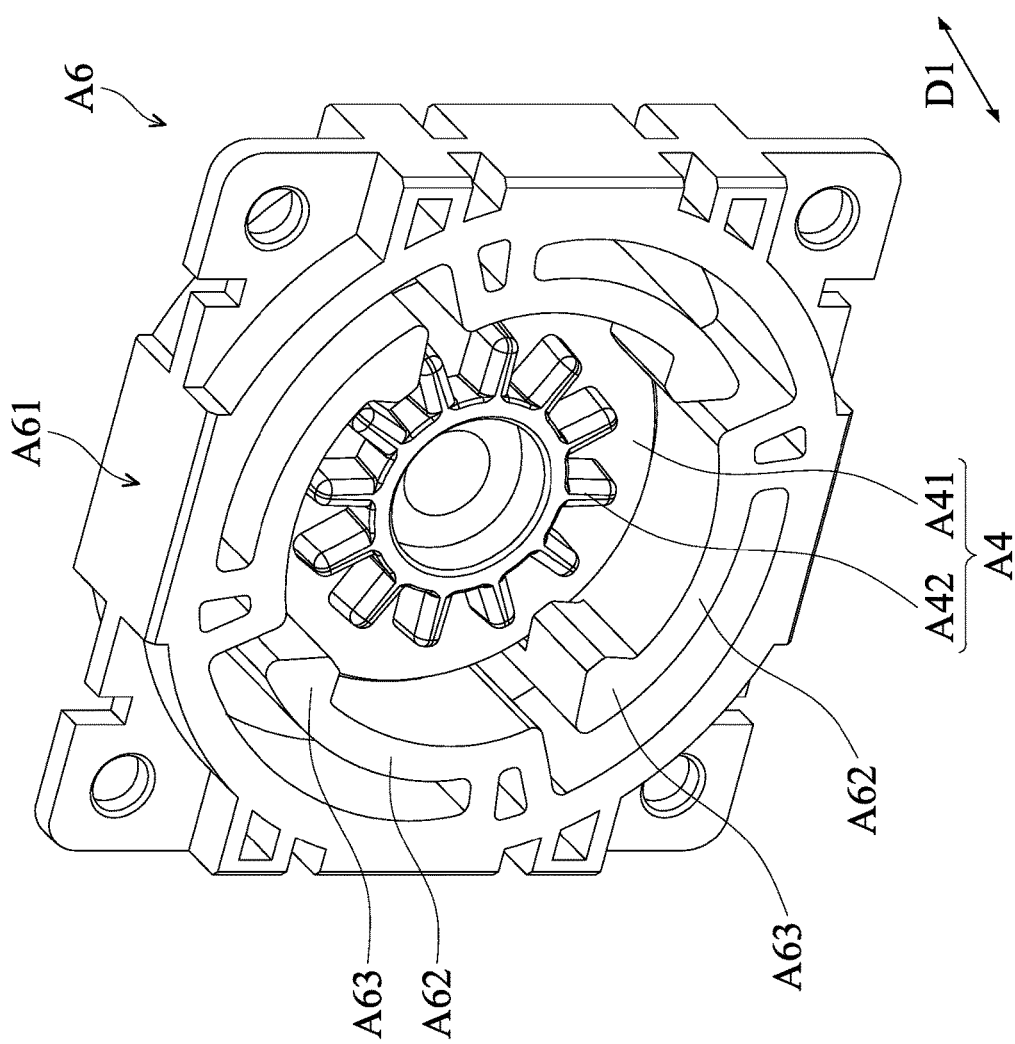

FIG. 13A is a cross-sectional view of the adjusting mechanism 33 in accordance with the second embodiment of the disclosure. In FIG. 13A, the cross section is parallel to or passes through the rotation axis AX1. FIG. 13B is a perspective view of the first rotary disk A4 and the switching structure A6 in accordance with the second embodiment of the disclosure. As shown in FIGS. 9B, 13A and 13B, the first rotary disk A4 and the driving gear A3 are located at the pressing location by pressing the button 34. The first rotary disk A4 is disengaged from the second rotary disk A5. Therefore, the adjusting mechanism 33 allows the first end 223 to move relative the second end 233. In other words, the length or size of the bonding structure 20 can be greatly adjusted by pressing the button 34.

Moreover, when the first rotary disk A4 is located at the pressing location, the switching protrusion A63 moves to a separation position by the switching arm A62. The elastic element E2 provides the elastic force to the first rotary disk A4, and thus the switching protrusion A63 abuts the edge of the first disk body A41 of the first rotary disk A4 in the extension direction D1. The switching protrusion A63 blocks the first rotary disk A4 and the driving gear A3 from moving to the initial position, and thus the first rotary disk A4 is kept disengaged from the second rotary disk A5. In other words, when the switching protrusion A63 is located at the separation position, the switching protrusion A63 blocks the first gear A42 from meshing with the second gear A54. Therefore, the length or size of the bonding structure 20 can be greatly adjusted without continually pressing the button 34.

Afterwards, when the first rotary disk A4 and the driving gear A3 are located at the pressing location, the first rotary disk A4 and the driving gear A3 can be moved to the initial position by rotating the rotation button 32. When the rotation button 32 is rotated, the third gear A55 of the second rotary disk A5 pushes the switching protrusion A63 from the separation position (as shown in FIGS. 13A and 13B) to the connection position (as shown in FIGS. 12A and 12B). Moreover, the first gear A42 meshes with the second gear A54 due to the elastic force of the elastic element E2. Therefore, the length or size of the bonding structure 20 is prevented from increasing, and the head-mounted display 1 is prevented from falling off of the user's head.

In conclusion, the user can rotate the rotation button with one hand to change the length or size of the bonding structure, and thus the head-mounted display can be easily donned and removed from the user's head.

The disclosed features may be combined, modified, or replaced in any suitable manner in one or more disclosed embodiments, but are not limited to any particular embodiments.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A head-mounted display, comprising:
a display device;
a bonding structure connected to the display device, and comprising:
a first bonding band having a first end; and
a second bonding band having a second end; and
an adjusting device connected to the bonding structure, and comprising:
a housing,
wherein the first bonding band and the second bonding band are movably disposed in the housing;
an adjusting mechanism disposed in the housing, and connected to the first bonding band and the second bonding band,
wherein the adjusting mechanism comprises:
a driving gear meshing with the first bonding band and the second bonding band; a first rotary disk disposed on the driving gear and comprising a first gear; and
a second rotary disk comprising a second gear selectively meshing with and separating from the first gear;
a button connected to the adjusting mechanism,
wherein when the button is pressed to a pressing location, the button pushes the first rotary disk to make the first rotary disk disengage from the second rotary disk; and
a rotation button connected to the adjusting mechanism, wherein when the rotation button is rotated, the adjusting mechanism changes a distance between the first end and the second end.

2. The head-mounted display as claimed in claim 1, wherein the first bonding band comprises a first gear rack, the second bonding band comprises a second gear rack, the adjusting mechanism comprises a driving gear meshing with the first gear rack and the second gear rack, wherein when the rotation button is rotated, the adjusting mechanism drives the driving gear to rotate.

3. The head-mounted display as claimed in claim 1, wherein the adjusting mechanism comprises:
an inner ratchet connected to the housing; and
a driving element disposed in the inner ratchet and connected to the rotation button,
wherein when the rotation button is rotated, the rotation button drives the driving element to rotate relative to the inner ratchet.

4. The head-mounted display as claimed in claim 3, wherein the driving element comprises:
a driving body;
an elasticity arm connected to the driving body; and
a blocking protrusion connected to the elasticity arm, and comprising a first inclined surface and a first blocking surface,
wherein the inner ratchet comprises a second inclined surface corresponding to the first inclined surface and a second blocking surface corresponding to the first blocking surface,
wherein when the rotation button is rotated in a first rotation direction, the driving element is rotated in the first rotation direction relative to the inner ratchet, and the first inclined surface slides along the second inclined surface,
wherein when the rotation button is rotated in a second rotation direction, which is opposite the first rotation direction, the rotation button drives the elasticity arm to move generally toward a center of the driving body so as to rotate the driving element in the second rotation direction relative to the inner ratchet, and to remove the first blocking surface from the second blocking surface.

5. The head-mounted display as claimed in claim 4, wherein when the rotation button is not rotated and the first bonding band and/or the second bonding band is pulled, the first blocking surface abuts the second blocking surface so as to prevent the driving element from rotating in the second rotation direction relative to the inner ratchet.

6. The head-mounted display as claimed in claim 4, wherein the elasticity arm comprises a guiding hole, and the rotation button comprises a guiding element extending into the guiding hole, and when the rotation button is rotated in the second rotation direction, the guiding element pushes the elasticity arm generally toward the center of the driving body.

7. The head-mounted display as claimed in claim 1, wherein after the button is pressed to the pressing location, the adjusting mechanism allows the first end to move relative to the second end.

8. The head-mounted display as claimed in claim 7, wherein when the button is located at an initial position, and the rotation button is not rotated, the adjusting mechanism prevents the first end from moving relative to the second end.

9. The head-mounted display as claimed in claim 1, wherein the adjusting mechanism further comprises an elastic element disposed in the housing and configured to provide an elastic force to the driving gear, wherein when the rotation button is rotated, the elastic element drives the first gear to mesh with the second gear using elastic force.

10. The head-mounted display as claimed in claim 1, wherein the adjusting mechanism further comprises a switching structure surrounding the second gear, and the switching structure comprises a switching arm and a switching protrusion disposed on the switching arm, wherein the switching protrusion is configured to selectively block the first gear from meshing with the second gear.

11. The head-mounted display as claimed in claim 10, wherein the second rotary disk further comprises a third gear, wherein the third gear selectively moves the switching protrusion to a connection position or a separation position,
    wherein when the switching protrusion is located at the connection position, the first gear meshes with the second gear, and when the switching protrusion is located at the separation position, the switching protrusion blocks the first gear from meshing with the second gear.

\* \* \* \* \*